United States Patent [19]
Azumano et al.

[11] Patent Number: 6,045,315
[45] Date of Patent: Apr. 4, 2000

[54] ROBOT APPARATUS AND TREATING APPARATUS

[75] Inventors: Hidehito Azumano, Zama; Atsushi Kinase, Yokohama; Kimio Kogure, Tokyo; Hisataka Komatsu, Yokohama, all of Japan

[73] Assignees: Shibaura Engineering Works Co., Ltd., Yokohama; Kabushiki Kaisha Toshiba, Kawasaki, both of Japan

[21] Appl. No.: 09/137,648

[22] Filed: Aug. 20, 1998

[30] Foreign Application Priority Data

Aug. 25, 1997 [JP] Japan ..................................... 9-228494
Jul. 22, 1998 [JP] Japan ................................... 10-206270

[51] Int. Cl.⁷ .................................................. B65G 49/07
[52] U.S. Cl. ......................... 414/217; 414/744.2; 414/939
[58] Field of Search ................................ 414/217, 217.1, 414/744.2, 744.4, 744.5, 935, 939; 901/21

[56] References Cited

U.S. PATENT DOCUMENTS

| | | | |
|---|---|---|---|
| 4,657,621 | 4/1987 | Johnson et al. | 414/939 X |
| 4,923,584 | 5/1990 | Bramhall, Jr. et al. | 414/217 X |
| 5,333,986 | 8/1994 | Mizukami et al. | 414/939 X |
| 5,430,271 | 7/1995 | Orgami et al. | 414/935 X |
| 5,516,732 | 5/1996 | Flegal | 414/939 X |
| 5,588,789 | 12/1996 | Muka et al. | 414/939 X |
| 5,807,062 | 9/1998 | Schultz et al. | 414/744.2 |
| 5,863,170 | 1/1999 | Boitnott et al. | 414/939 X |
| 5,975,834 | 11/1999 | Ogawa et al. | 414/744.5 |

FOREIGN PATENT DOCUMENTS

| | | | |
|---|---|---|---|
| 6069316 | 3/1994 | Japan | 414/935 |
| 2511566 | 6/1996 | Japan . | |
| 9-8096 | 1/1997 | Japan . | |

*Primary Examiner*—James W. Keenan
*Attorney, Agent, or Firm*—Christensen O'Connor Johnson & Kindess PLLC

[57] ABSTRACT

A robot apparatus has a rotatable arm member. A stationary pulley is arranged in the center of the arm member, while a pair of rotatable pulleys are arranged at the respective ends of the arm member. A pair of fingers, used for conveying a work, are attached to the respective rotatable pulleys. A driving force transmission member is engaged with the stationary pulley and the rotatable pulleys. When the arm member is rotated, the driving force transmitting means rotates the rotatable pulleys in accordance with the outer diameter ratio of the stationary pulley to the rotatable pulleys.

6 Claims, 17 Drawing Sheets

ROBOT APPARATUS AND TREATING APPARATUS

BACKGROUND OF THE INVENTION

The present invention relates to a robot apparatus used for the transfer of works, and a treating apparatus for treating the works in a vacuum state.

In the manufacture process in which a circuit pattern is formed on a work (e.g., a semiconductor wafer, or a glass substrate for a liquid crystal display, a variety kinds of treatments must be executed.) A vacuum chamber is employed for the treatments.

A so-called multi-chamber system is known as a system that enables the work to be treated with high efficiency. According to this system, a number of treatment chambers are provided, and the treatments in the respective treatment chambers are executed simultaneously or sequentially.

According to the multi-chamber system, the work is treated as follows. A robot apparatus receives an untreated work from a supply section and transfers it to a treatment chamber. After the work is treated, the robot apparatus receives the work from the treatment chamber and then transfers it to another treatment chamber or conveys it to another treatment section.

In order to increase the productivity, the robot apparatus has to receive a work and transfer it to another section within a short time. Also, the robot apparatus has to be as small as possible.

In the case of the multi-chamber system described above, a number of treatment chambers and a number of load lock chambers are arranged around the robot apparatus in such a manner that they are spaced apart at the predetermined intervals in the circumferential direction.

Since the treatment chambers have to be arranged at the predetermined intervals in the circumferential direction, a useless space exists between the adjacent treatment chambers, and the entire installation space of the system is wide, accordingly. In addition, the fingers of the robot have to be rotated in a desired direction. Since this rotation requires a certain length of time, the overall tact time is inevitably long.

BRIEF SUMMARY OF THE INVENTION

Accordingly, an object of the present invention is to provide a robot apparatus that can realize a short tact time without incurring an increase in size and manufacturing cost.

Another object of the present invention is to provide a treating apparatus that enables a plurality of treating apparatuses to be arranged without a useless space.

According to a preferred embodiment of the invention, a robot apparatus for transferring a work comprises:

a support member;

an arm member attached to the support member;

driving means for rotating the arm member;

a stationary pulley provided for the support member and located at the center of rotation of the arm member;

a pair of rotatable pulleys provided for the respective ends of the arm member;

a pair of fingers attached at one end to each of the rotatable pulleys and used for conveying the work; and driving force transmitting means, engaged with the stationary pulley and the rotatable pulleys, for rotating the rotatable pulleys in response to rotation of the arm member, the driving force transmitting means rotating the rotatable pulleys in accordance with an outer diameter ratio of the stationary pulley to the rotatable pulleys.

According to another preferred embodiment of the invention, a treating apparatus for treating a work in a vacuum state comprises:

a transfer chamber having one side in which a plurality of transfer ports are formed side by side;

a plurality of treatment chambers connected to the transfer ports, respectively, and arranged side by side;

transfer tables arranged inside the transfer chamber and located at positions opposed to the respective transfer ports, the transfer table receiving untreated works externally supplied thereto and also receiving works that have been treated in the respective treatment chambers; and a first robot apparatus, provided between each of the transfer tables and the corresponding one of the treatment chambers, for transferring a work between the corresponding transfer table and the corresponding treatment chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
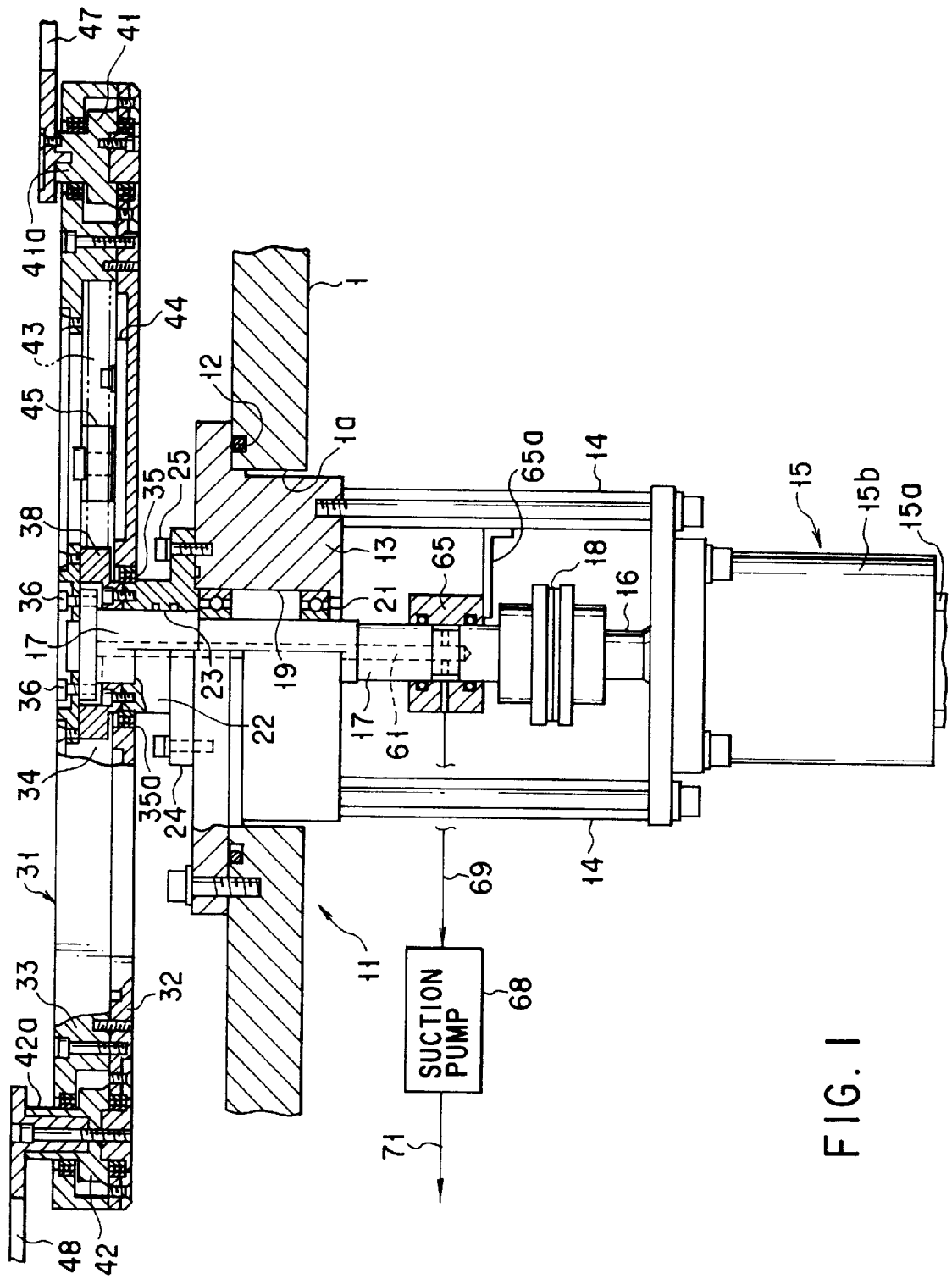
FIG. 1 is a partially-sectional front view showing a first robot apparatus according to one embodiment of the preset invention.

Embodiments of the present invention will now be described with reference to the accompanying drawings.

FIGS. 1 through 18 illustrate the first embodiment of the present invention. The treatment chamber shown in FIG. 5 comprises a transfer chamber 1, the internal pressure of which can be reduced. A plurality of first transfer ports 2 are formed in a side wall of the transfer chamber 1. According to the first embodiment, two first transfer ports 2 are formed side by side, and a first treatment chamber 3a and a second treatment chamber 3b are connected to the side wall, with the internal spaces of the chambers communicating with the two first transfer ports. In other words, the first treatment chamber 3a and the second treatment chamber 3b are arranged side by side in such a manner that they are adjacent to the outer side of one side wall of the transfer chamber 1.

Each of the first transfer ports 2 is closed or opened by means of an internal valve 4.

Inside the first chamber 1, a first transfer table 5a is located in opposition to one of the first transfer ports 2, and a second transfer table 5b is located in opposition to the other first transfer port 2. The first and second transfer tables 5a and 5b can be vertically moved. Three push pins 6 are provided in the center of the top surface of each table.

In the normal state, the push pins 6 are at the lower position. They are raised when semiconductor wafers U (i.e., works to be treated) supplied onto the transfer tables 5a and 5b are transferred. By means of the push pins 6, the semiconductor wafers U can be lifted from the top surfaces of the transfer tables 5a and 5b by a predetermined distance.

Figure 6:
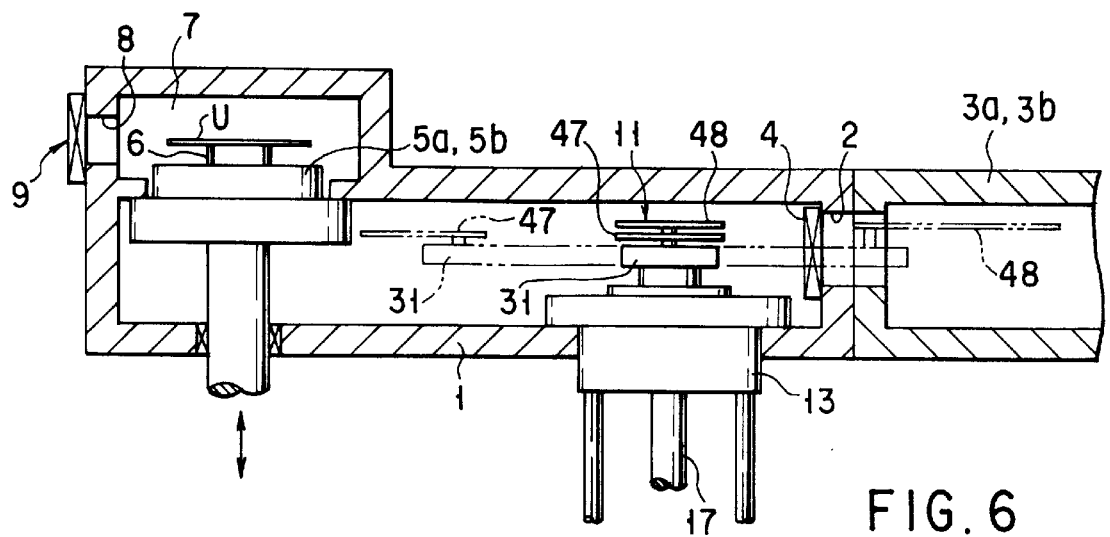
FIG. 6 is a longitudinal section of the transfer chamber of the same embodiment.
Figure 7:
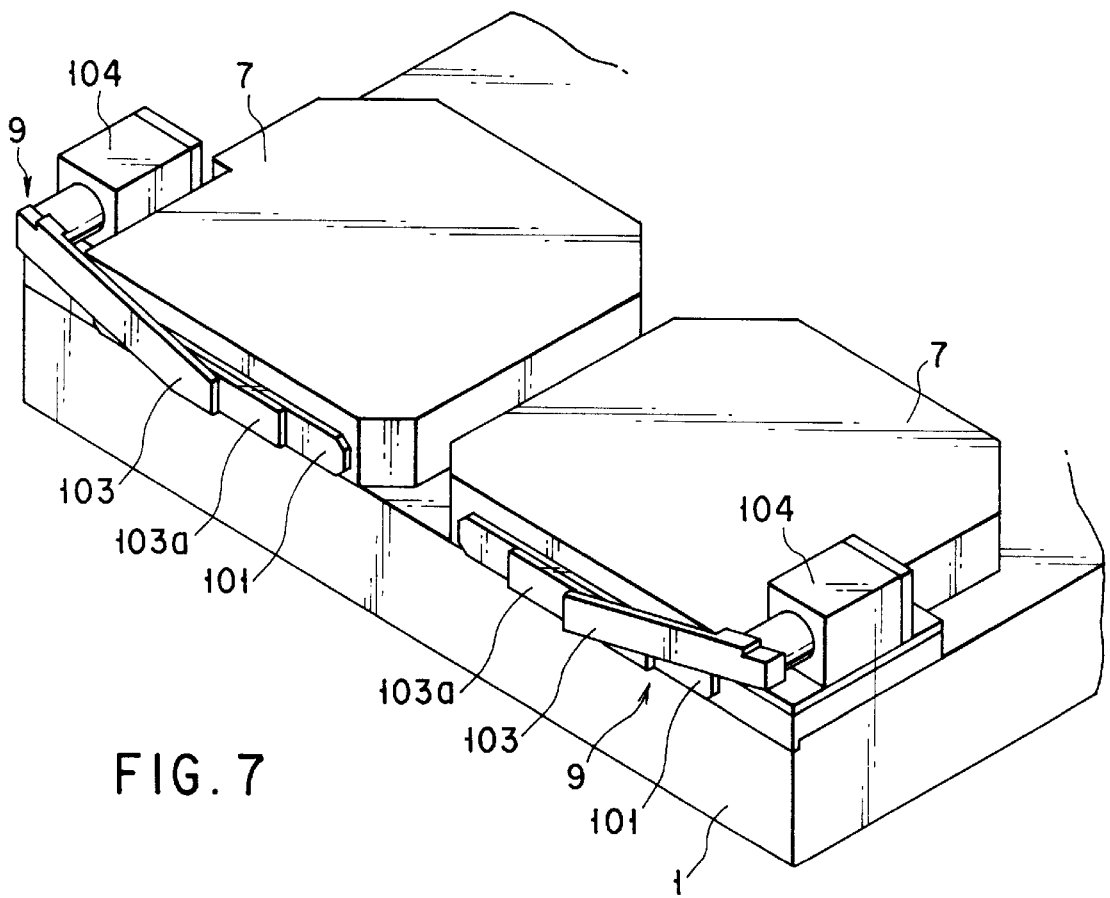
FIG. 7 is a perspective view of the outward appearance of the transfer chamber.

In the upper wall of the transfer chamber 1, load lock chambers 7, communicating with the internal space of the transfer chamber 1, are formed in such a manner they correspond to the first and second transfer tables 5a and 5b, as shown in FIGS. 6 and 7.

When the transfer tables 5a and 5b are raised, the load lock chambers 7 hermetically sealed thereby. In other words, the inside spaces of the load lock chambers 7 are partitioned off from the internal space of the transfer chamber 1. A second transfer port 8 is formed in one side wall of each load lock chamber 7, and this transfer port 8 is opened or closed by means of a atmospheric pressure valve 9.

Figure 8:
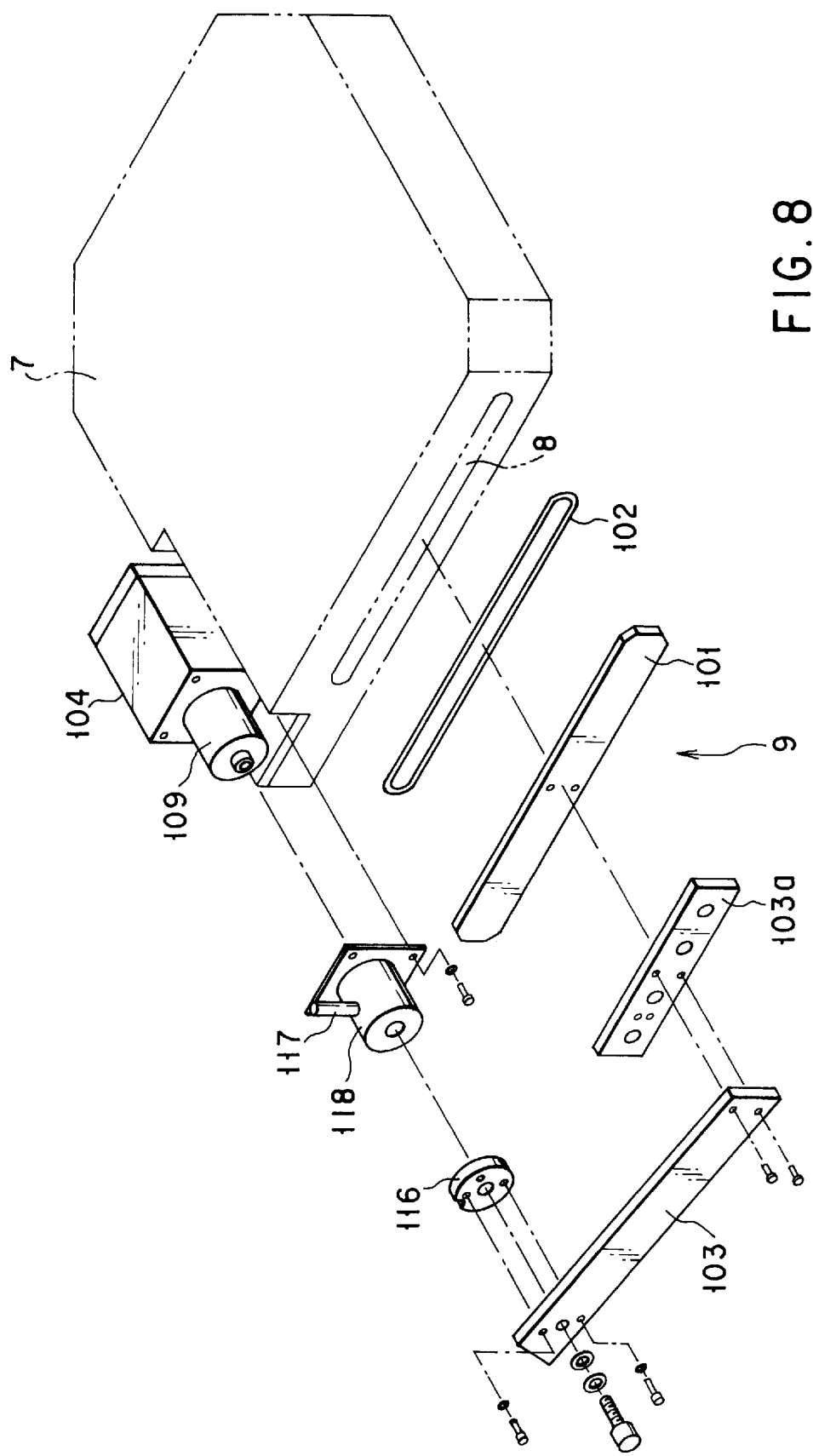
FIG. 8 is an exploded perspective view of the atmospheric pressure valve of the same embodiment.

As shown in FIG. 8, the atmospheric pressure valve 9 has a valve body 101. This valve body 101 is a rectangular belt-like member and has an area greater than that of the opening of the second transfer port 8. Although not shown, a dovetail groove is formed in that side surface of the valve body 101 which is brought into contact with the outer wall of the load lock chamber 7. An O-ring 102 is fitted in the dovetail groove, with a radial part projected therefrom, in such a manner that the O-ring 102 does not come off the dovetail groove.

A belt-like arm member 103 is attached at one end to the other side surface of the valve body 101, with a fixing plate 103a interposed. The arm member 103 is attached to the valve body 101 at a middle position in the longitudinal direction of the valve body 101. The arm member 103 is driven by a driving means 104, which is arranged on the side of the load lock chamber 7. The fixing plate 103a may be omitted if its function can be compensated for by both the arm member 103 and the valve body 101.

Figure 9:
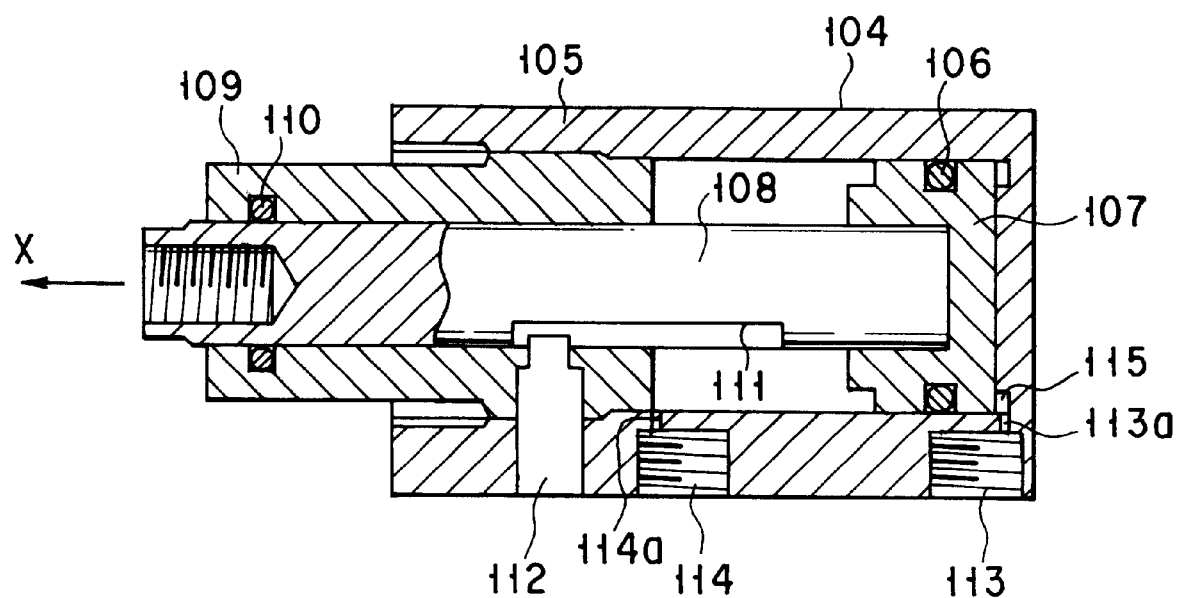
FIG. 9 is a longitudinal section of a cylinder serving as a driving means.

As shown in FIG. 9, the driving means 104 comprises a cylinder 105. A piston 107, having piston packing 106 on the outer circumference, is slidably inserted in the interior of the cylinder 105. One end of a piston rod 108 is coupled to the piston 107.

The other end of the piston rod 108 extends through a tubular rod cover 109, which is attached to the open section located at one end of the cylinder 105, and is projected outwardly from the rod cover 109. Rod packing 110 is provided on the inner circumferential surface of the rod cover 109, so as to provide a hermetic seal between the rod cover 109 and the piston rod 108.

Figure 10:
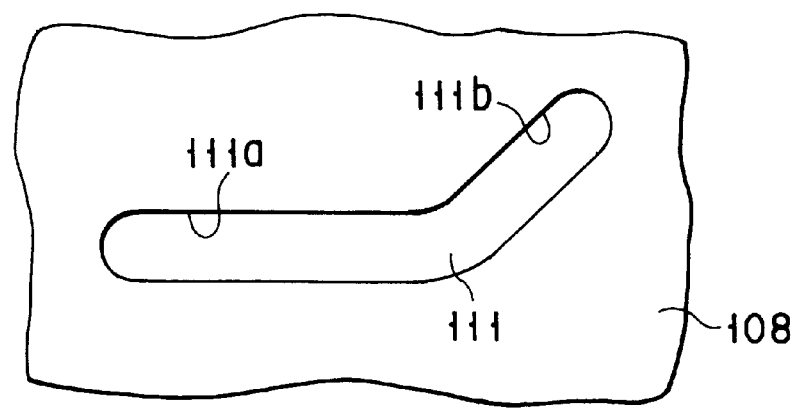
FIG. 10 is a development of a cam groove formed in a piston rod of the embodiment.

A cam groove 111 is formed in the outer circumferential surface of that portion of the piston rod 108 which is located within the cylinder 105. FIG. 10 is a development showing the cam groove 111. The cam groove 111 includes a linear section 111a extending in parallel to the axis of the piston rod 108, and an inclined section 111b being continuous with one end of the linear section 111a and extending in the circumferential direction of the piston rod 108.

A guide shaft 112, engageable with the cam groove 111, penetrates the cylinder 105 in a hermetical manner. Therefore, the piston rod 108 is driven, with its cam groove 111 guided by the guide shaft 112.

The cylinder 105 has a first port 113 and a second port 114. Compressed air is supplied or exhausted from one side of the piston 107 through the first port 113, and is supplied or exhausted from the other side of the piston 107 through the second port 114. The first and second ports 113 and 114 communicate with the interior of the cylinder 105 by way of air passages 113a and 114a, respectively.

As shown in FIG. 9, when the piston 107 is at the retreat limit position, and compressed air is supplied from the first portion 113, the compressed air flows from the air passage 113a into an annular groove 115 formed in the inner bottom portion of the cylinder 105. As a result, the piston 107 is driven in the advancing direction indicated by arrow X in FIG. 9.

When compressed air is supplied from the second port 114 in the state where the piston 107 is at the advance limit position, the piston 107 is driven in the retreating position which is opposite to the direction indicated by arrow X.

The piston rod 108 moves together with the piston 107. When the piston 107 is driven from the retreat limit position in the arrow X direction, the guide shaft 112 moves along the linear section 111a of the cam groove 111 and then moves along the inclined section 111b thereof. Therefore, the piston rod 108 is linearly driven while the guide shaft 112 moves along the linear section 111a of the cam groove 111, and is linearly driven and simultaneously rotated while the guide shaft 112 moves along the inclined section 111b. The other end of the arm member 103 described above is connected to the piston rod 108 by means of a coupling 116.

With the above structure, the valve body 101, coupled to the piston rod 108 through the arm member 103, interlocks with the movement of the piston rod 108. Incidentally, reference numeral 118 in FIG. 8 denotes a dust cover provided with a suction tube 117. The rod cover 109 described above is covered with this dust cover 118, and dust generated in the neighborhood of the rod cover 109 is expelled through the suction tube 117.

Figure 11A:
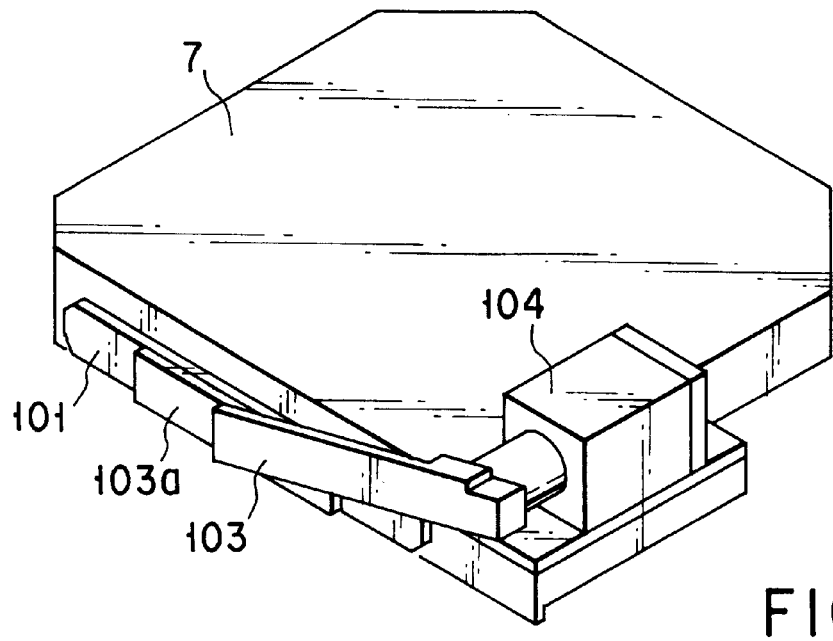
FIGS. 11A and 11B are perspective views showing how the atmospheric pressure valve operates.
Figure 11B:
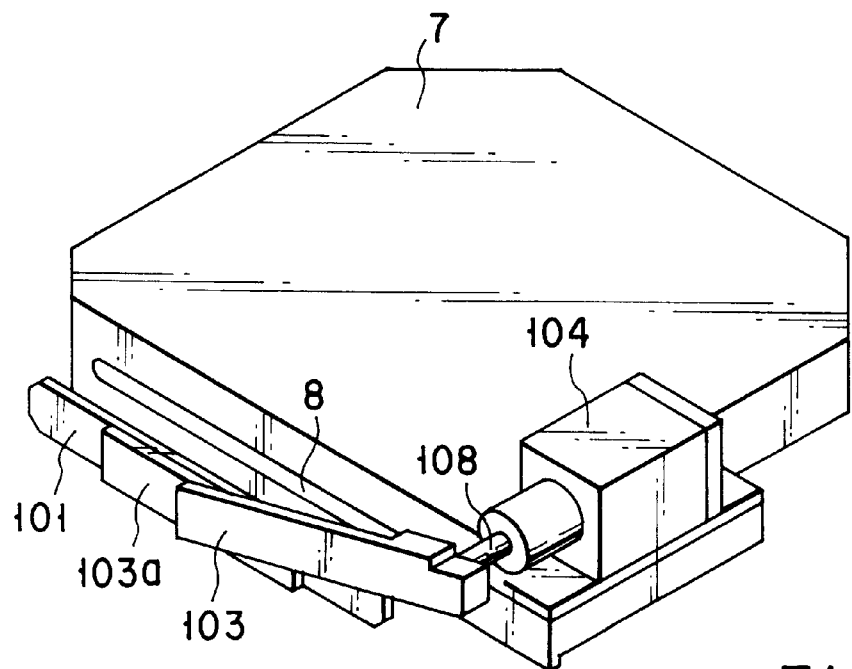

FIGS. 11A, 11B and FIGS. 12A to 12C show how the valve body 101 moves in association with the movement of the piston rod 108. FIG. 11A shows the state where the piston 107 is at the retreat limit position. In this state, the valve body 101 closes the second transfer port 8 of a load lock chamber 7 in an air-tight manner. When the piston rod 108 is linearly driven along the linear section 111a of the cam groove 111, the valve body 101 moves away from the second transfer port 8 in parallel thereto, as shown in FIG. 11B.

Figure 12A:
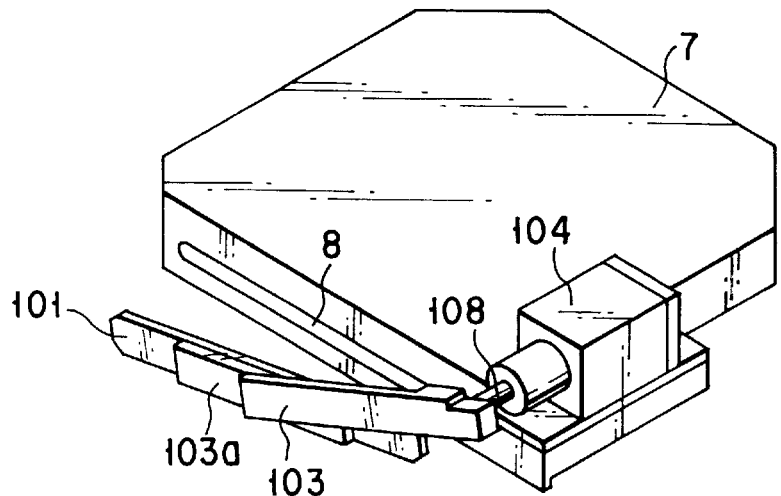
FIGS. 12A to 12C are also perspective views how the atmospheric pressure valve operates.
Figure 12B:
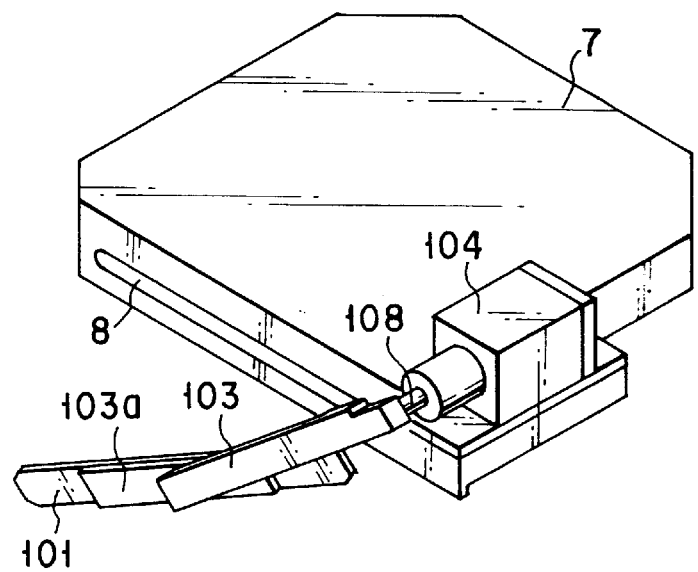
Figure 12C:
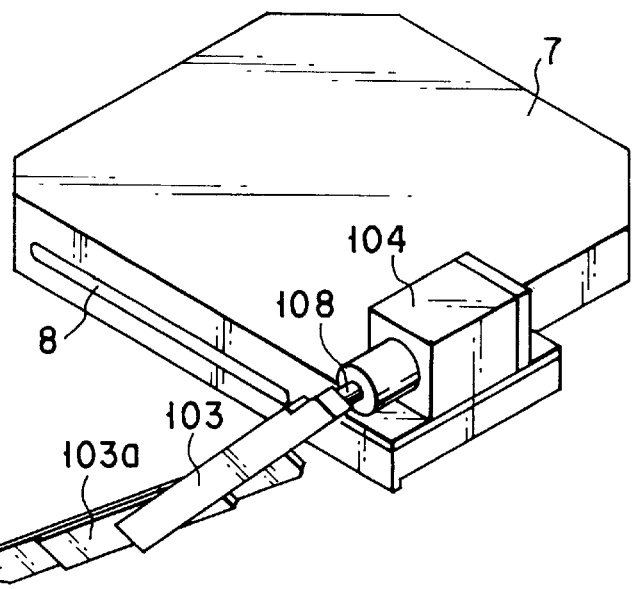

When the piston rod 108 is driven along the inclined section 111b of the cam groove 111 and comes to the advance limit position while rotating, the valve body 101 is rotated downward and retreats from the region in front of the second transfer port 8, shown in FIGS. 12A to 12C. Accordingly, a semiconductor wafer U can be moved into the load lock chamber 7 or taken out therefrom by way of the second transfer port 8.

When the piston rod 108 is driven from the advance limit position to the retreat limit position, the valve body 101 moves in the opposite manner to that described above, and the second transfer port 8 is closed in an air-tight manner.

As described above, the valve body 101 is linearly moved and simultaneously rotated, so as to open or close the second transfer port 8. With this structure, the O-ring 102 provided for the valve body 101 does not rub against the wall surfaces of the load lock chamber 7 when the second transfer port 8 is opened or closed. Accordingly, early damage to the O-ring 102 or the wall surfaces of the load lock chamber 7 is prevented.

In addition, the vertical and horizontal movements of the valve body 101 is attained by the driving means 104 that is made of a single cylinder 105. This leads to a simple structure and a reduction in size.

Inside the transfer chamber 1, a first robot apparatus 11 is arranged between each of the first transfer ports 2 and the corresponding transfer table 5a and 5b. As shown in FIG. 1, the robot apparatus 11 comprises a coupling member 13, and this coupling member 13 is hermetically fitted in a coupling hole 1a formed in the bottom wall of the transfer chamber 1 in such a manner that an O-ring 12 is interposed between the coupling member 13 and the wall of the coupling hole 1a. The lower side of the coupling member 13 is coupled to a driving source 15 by means of coupling rods 14. The driving source 15 is a combination of a motor 15a and a speed reducing unit 15b.

A driving shaft 17 is connected to the output shaft 16 of the driving source 15 by means of a coupling 18. The driving shaft 17 extends via a through hole 19 formed in the coupling member 13 and is rotatably supported by a bearing 21. The distal end portion of the driving shafted 17 is projected into the transfer chamber 1. The driving shaft 17 increases in diameter stepwise in the direction toward the upper end.

The distal end portion of the driving shaft 17, which is projected into the transfer chamber 1, is inserted via a through hole 23 formed in a push member 22 in such a manner that the driving shaft 17 is rotatable and provides a hermetic seal. A flange 24 is formed at the lower portion of the push member 22. The flange 24 is in contact with the upper surface of the coupling member 13, and is fixed thereto by means of screws 25.

An arm member 31 has its longitudinal center fixedly coupled to the distal end of the driving shaft 17 which is projected from the through hole 23 of the push member 22. The arm member 31 is made by coupling a lower case 32 and an upper case 33 together, and a storage space 34 is defined between them.

The lower case 32 has a through hole 35 formed in the center thereof. The upper end of the push member 22 is inserted in the through hole 35 and rotatably supported by a bearing 35a. The distal end of the driving shaft 17, which is supported by the push member 22, is projected into the storage space 34 described above. The distal end face of the driving shaft 17 is in contact with the inner surface of the upper case 33 and is fixed by means of screws 36.

A stationary pulley 38 is fixedly attached to the distal end portion of the push member 22, which is projected into the storage space 34. The stationary pulley 38 is located in the longitudinal center of the arm member 31.

A first rotatable pulley 41 is rotatably arranged at one longitudinal end of the storage space 34, while a second rotatable pulley 42 is rotatably arranged at the other longitudinal end of the storage space 34. An endless timing belt 43, serving as a driving force transmission means, is engaged with the rotatable pulleys 41 and 42 and the stationary pulley 38. The timing belt is wound around those pulleys. A pair of tension rollers 45, attached to an adjusting plate 44, are arranged between the stationary pulley 38 and the rotatable pulleys 41 and 42 at predetermined intervals. The adjusting plate 44 can be adjusted in position in the longitudinal direction of the arm member 31. Accordingly, the tension of the timing belt 43 can be adjusted by varying the position of the adjusting plate 44.

The ratio of the number of teeth of the stationary pulley 38 to the number of teeth of each rotatable pulley 41, 42 (namely, the outer diameter ratio) is 2:1. With this structure, when the stationary pulley 38 and the rotatable pulley 41, 42 rotate relative to each other, the rotating speed of them is 2:1.

Fixing shafts 41a and 42a protrude from the upper sides of the rotatable pulleys 41 and 42, respectively. The fixing shafts 41a and 42a are projected outwardly from the upper case 33. A first finger 47 is attached to the fixing shaft 41a of the first rotatable pulley 41, while a second finger 48 is attached to the fixing shaft 42a of the second rotatable pulley 42.

The fixing shaft 41a of the first rotatable pulley 41 is shorter than that 42a of the second rotatable pulley 42. Accordingly, the first finger 47 is lower in level than the second finger 48.

Figure 4:
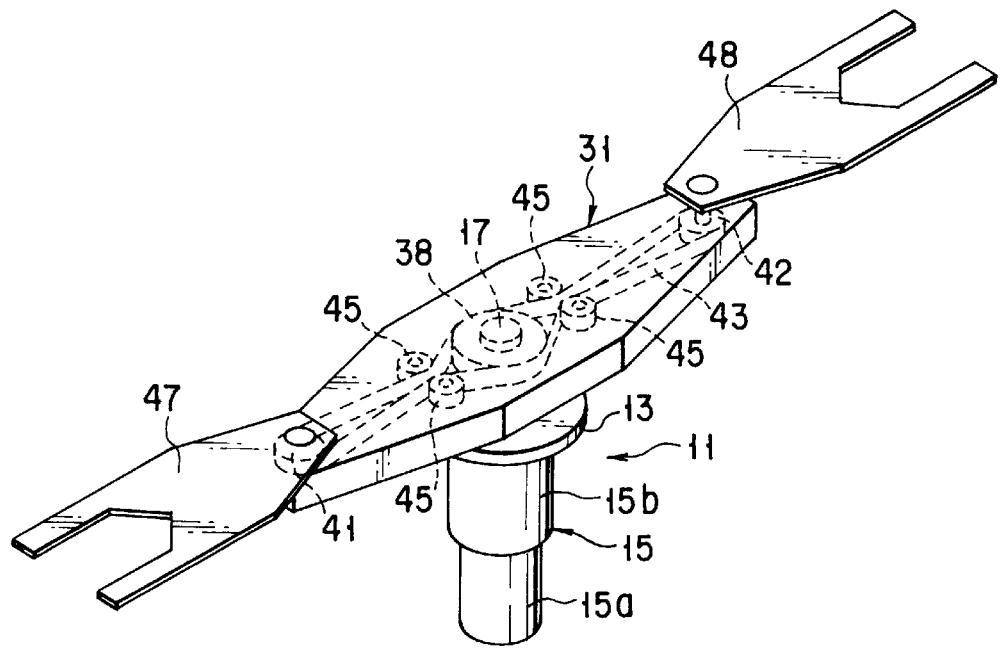
FIG. 4 is a perspective view of the first robot apparatus.
Figure 5:
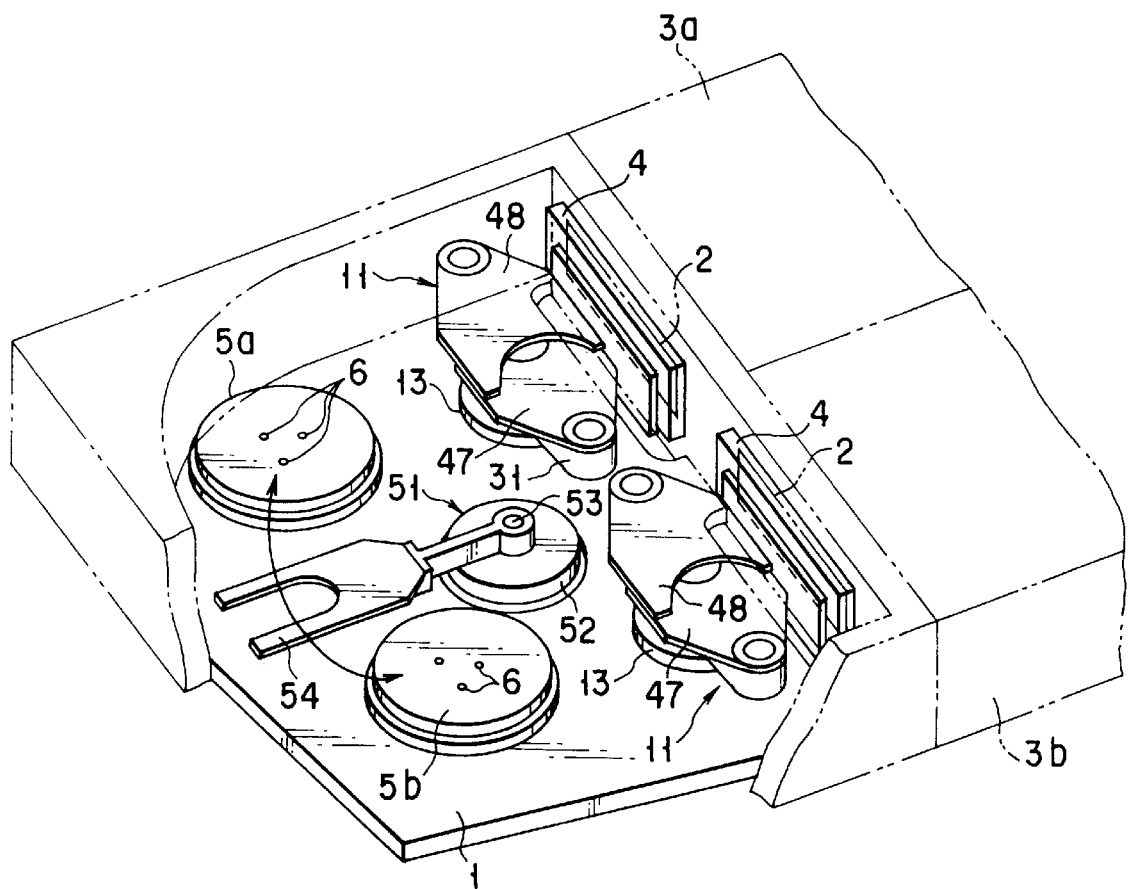
FIG. 5 is a perspective view that shows the treating apparatus of the embodiment by omitting illustration of the load lock chamber.

Since the first and second fingers 47 and 48 are different in level, they do not strike against each other even when they are rotated 90° from the positions shown in FIG. 4 (at which they are on an extension line extending in the longitudinal direction of the arm member 31) to the positions shown in FIG. 5 (at which they are located above the arm member 31.) In the state shown in FIG. 5, they face each other, with a predetermined distance maintained in the vertical direction.

Figure 2:
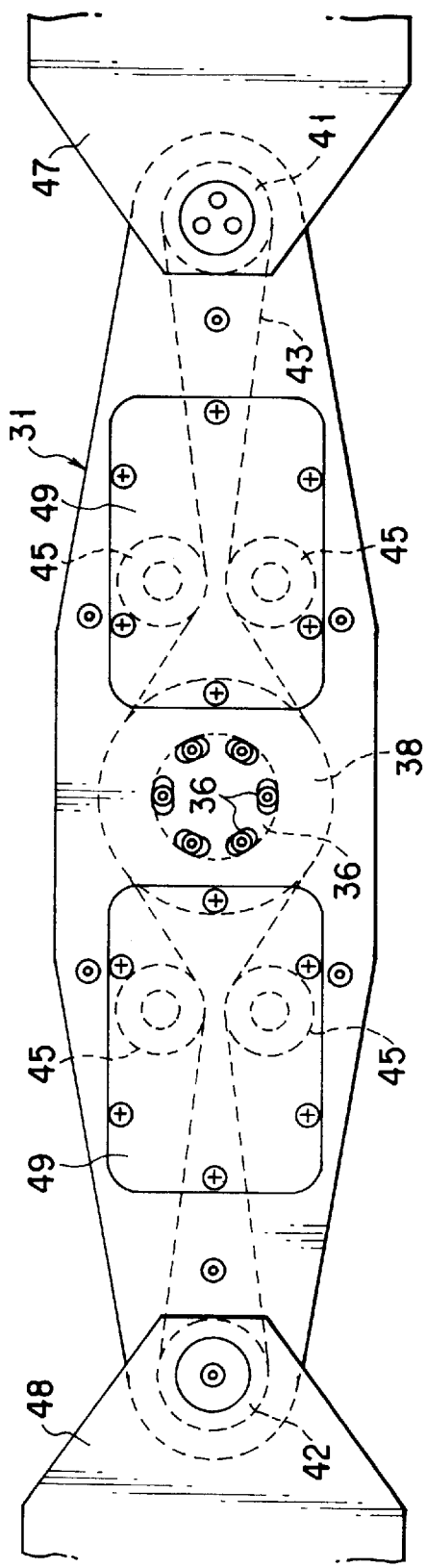
FIG. 2 is a plan view showing an arm member of the same embodiment.

As shown in FIG. 2, a pair of cover plates 49 are removably attached to the upper case 33 of the arm member 31. With the cover plates 49 removed, the storage space can be inspected.

Figure 13:
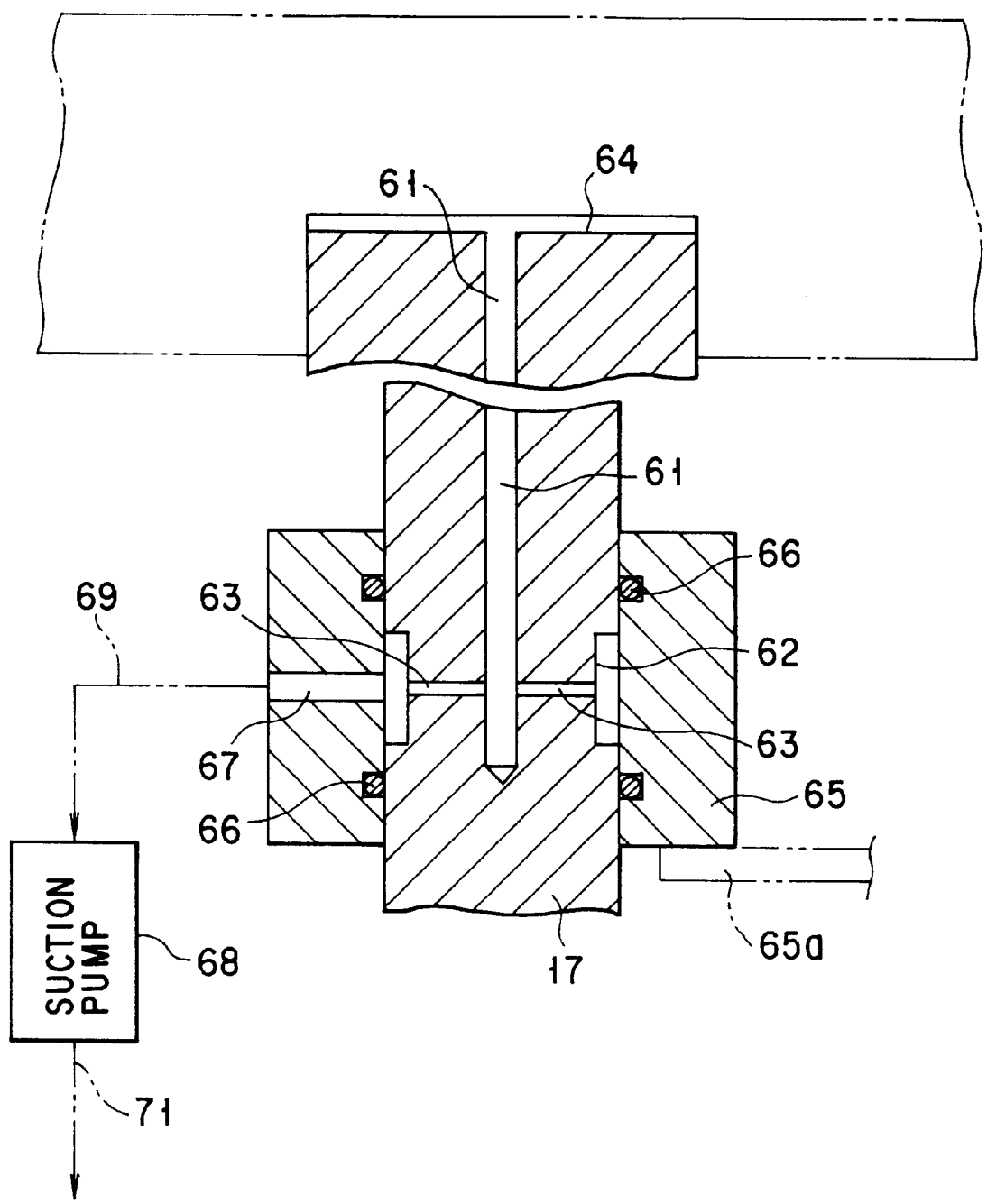
FIG. 13 is a sectional view showing a through hole formed in the driving shaft of the robot apparatus.

As shown in FIGS. 1 and 13, the driving shaft 17 described above has a through hole 61 extending in the axial direction. A circumferential groove 62 is formed in that outer circumferential portion of the driving shaft 17 which corresponds to the lower end of the through hole 61. The circumferential groove 62 and the through hole 61 communicate with each other by way of a number of bottom discharge holes 63. The upper end of the through hole 61 is open in the upper end face of the driving shaft 17, and a number of top discharge holes 64 extending in the radially direction are formed in that upper end face. Through the top discharge holes 64, the through hole 61 communicates with the storage space 34 of the arm member 31.

In this embodiment, two or more bottom discharge holes 63 and two or more top discharge holes 64 are provided. Needless to say, a single bottom discharge hole and a single top discharge hole may be provided.

A cylindrical housing 65 is rotatably provided on that portion of the driving shaft 17 which has the circumferential groove 62. The housing 65 has O-rings 66 for providing a hermetic seal between the housing 65 and the driving shaft 17. The housing 65 has a suction hole 67 communicating with the circumferential groove 62. The suction end of a suction pump 68 is connected to the suction hole 67 through a suction tube 69. The air exhausted by the suction pump 68 flows through an exhaust tube 71 and led out to a desired region, e.g., to the outside of the transfer chamber 1 in which the robot apparatus 11 is arranged.

The housing 65 is connected and fixed to the coupling rods 14 described above by means of a coupling member 65a.

Figure 3:
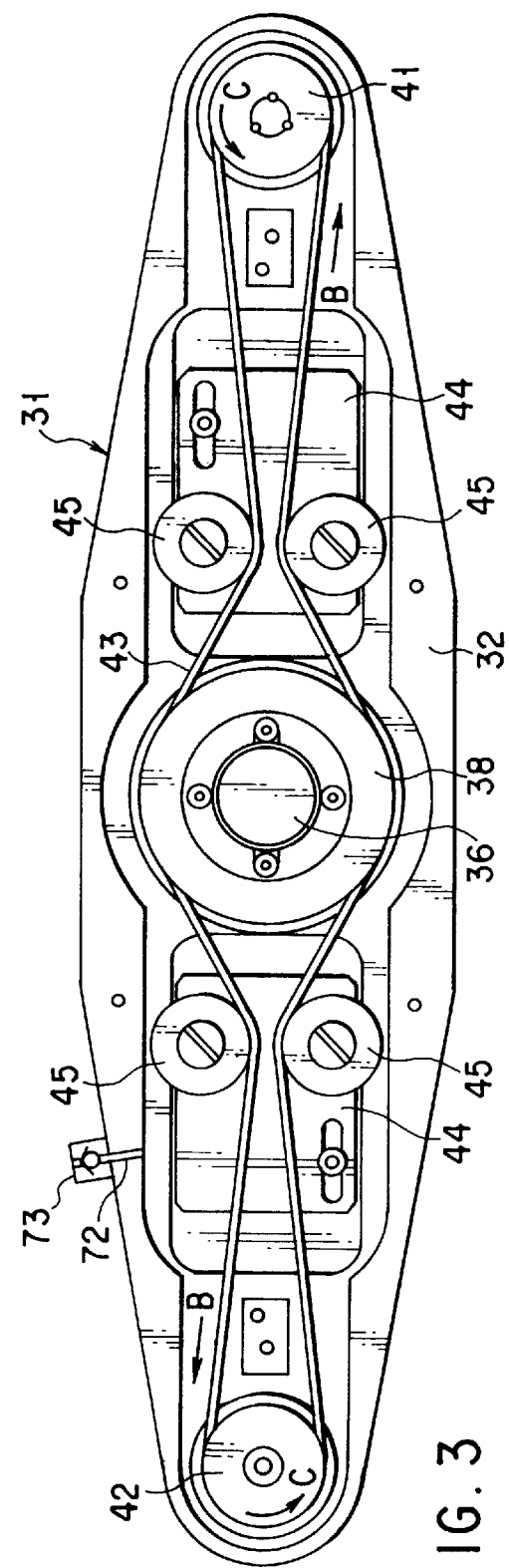
FIG. 3 is a plan view that shows the internal structure of the arm member by omitting illustration of the upper case thereof.

As shown in FIG. 3, the arm member 31 has an introducing hole 72 formed in the side portion thereof. The introducing hole 72 allows communication between the storage space 34 of the arm member 31 and the outside, and a check valve 73 is arranged in the introducing hole 72. The check valve 73 is arranged in such a manner that the outside air can flow into the storage space 34.

When the suction pump 68 is driven, and the pressure in the storage space 34 decreases, the outside air flows into the storage space 34 through the check valve 73. By way of the through hole 61 described above, the air is discharged from the exhaust tube 71 to the outside of the transfer chamber 1.

Owing to the structure described above, dust generated when the robot apparatus 11 operates (i.e., dust due to the sliding contact between the timing belt 43 and the stationary pulley 38, the rotatable pulleys 41, 42, or the tension rollers 45, or dust due to rotation of the rotatable pulleys 41, 42) is prevented from flowing from the storage space 34 of the arm member 31 into the transfer chamber 1.

The first robot apparatus 11 of the above structure operates as follows. When the driving source 15 is actuated and the driving shaft 17 is rotated, the arm member 31 is driven. When the arm member 31 rotates in the direction indicated by arrow A in FIG. 3, the timing belt 43 moves in the direction indicated by arrow B, because the stationary pulley 38 does not rotate. Since, therefore, the paired rotatable pulleys 41 and 42 rotate in the direction indicated by arrow C, the paired fingers 47 and 48 are driven in accordance with the rotation.

Let us suppose that the angle of rotation of the arm member 31 is 0° when the paired fingers 47 and 48 are located above the arm member and look over with each other, with a certain distance maintained in the vertical direction. When the arm member 31 whose angle of rotation is 0° is rotated 90° in the direction indicated by arrow A, the paired fingers 47 and 48 are rotated 180°. Accordingly, they are in an extension line of the longitudinal axis of the arm member 31. In other words, the paired fingers 47 and 48 are projected from the respective ends of the arm member 31 and are aligned with the arm member 31.

As shown in FIG. 5, a second robot apparatus 51 is arranged between the first transfer table 5a and the second transfer table 5b. The second robot apparatus 51 comprises a base member 52, as shown in FIG. 5. A driving shaft 53 is projected from this base member 52, and the proximal end of a finger 54 is coupled to the driving shaft 53. The finger 54 is rotatable in the range indicated by the arrow, i.e., between the position where it is above the first transfer table 5a and the position where it is above the second transfer table 5b.

The finger 54 is higher in level than the upper surfaces of the transfer tables 5a and 5b, and is lower in level than the first finger 47 of the first robot apparatus 11. With this structure, when the first finger 47 is above the transfer table 5a or 5b, the finger 54 can be moved into the region between the table 5a or 5b and the first finger 47.

Figure 14A:
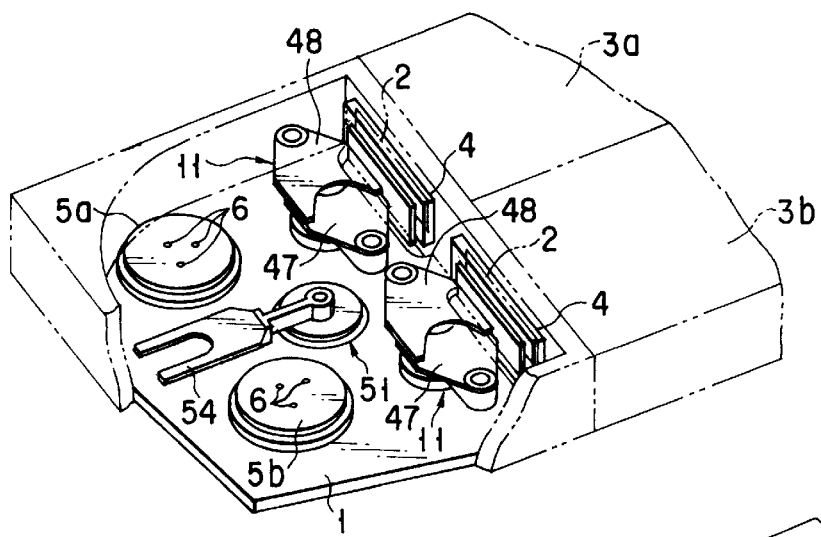
FIGS. 14A to 14C are explanatory views showing how the treating apparatus of the embodiment operates.

A description will be given, with reference to FIGS. 14A through 18, of the case where a semiconductor wafer U is treated by the treating apparatus described above. FIG. 14A illustrates a standby state. In this state, the first transfer table 5a is at the lower position, and the arm member 31 of each of the first robot apparatuses 11 is 0° in its angle of rotation. The second robot apparatus 51 has its finger 54 located at the middle position between the transfer tables 5a and 5b.

Figure 14B:
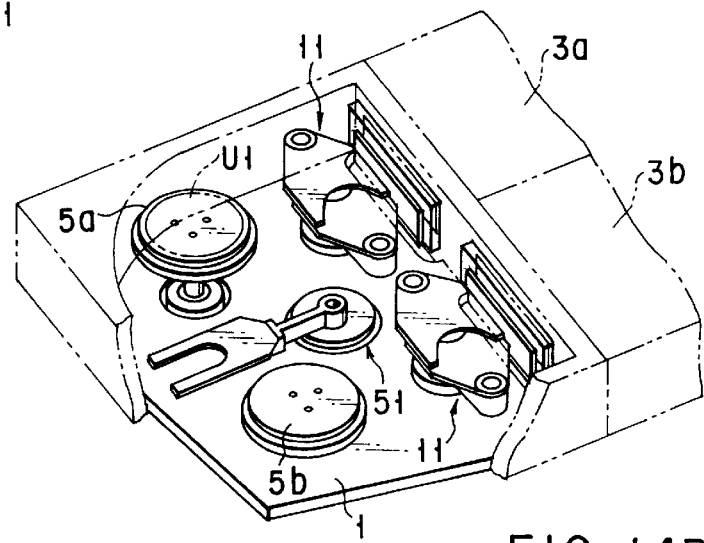

In this state, the first transfer table 5a is moved upward, as shown in FIG. 14B, and one of the load lock chambers 7 is sealed, as shown in FIG. 6. In response to this, the atmospheric pressure valve 9 is operated and the second transfer port 8 is opened. Through this second transfer port 8, an untreated semiconductor wafer U1 is supplied onto the first transfer table 5a. After the supply of the semiconductor wafer U1, the push pins 6 are raised, the atmospheric pressure valve 9 is operated again to hermetically seal the second transfer port 8.

Figure 14C:
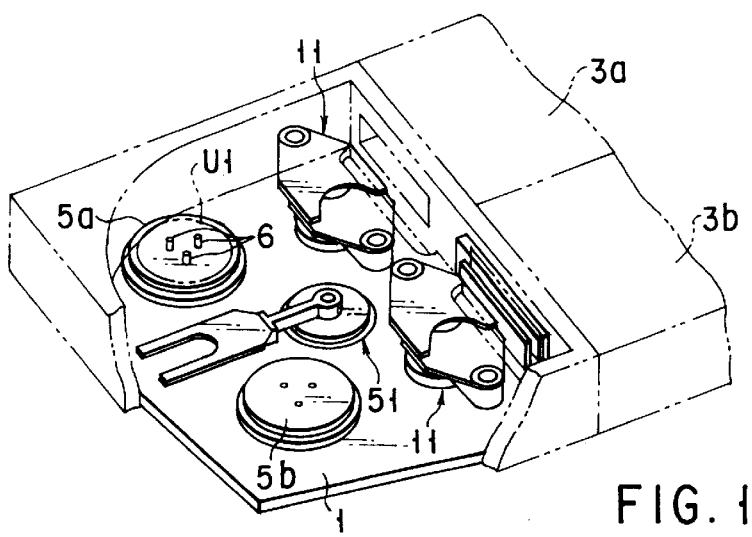

Subsequently, the first transfer table 5a is lowered, as shown in FIG. 14C. As a result, the semiconductor wafer U1 is held, while being kept away from the upper surface of the first transfer table 5a.

Figure 15A:
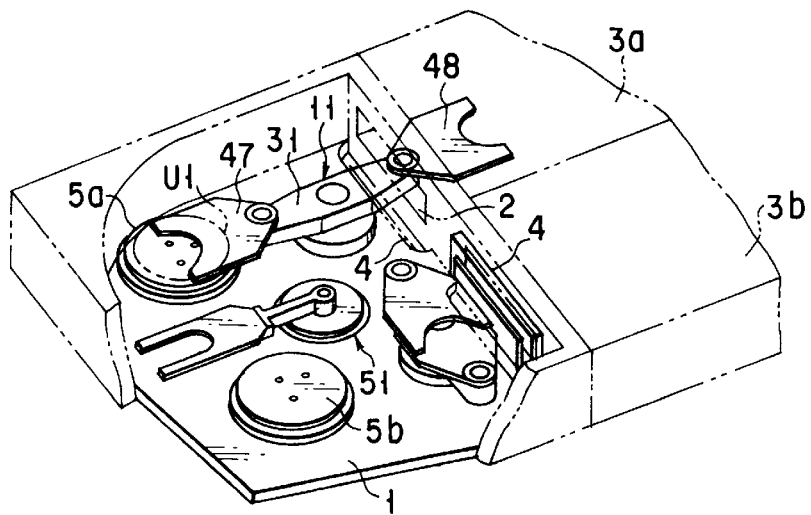
FIGS. 15A to 15C are also explanatory views showing how the treating apparatus of the embodiment operates.

Then, as shown in FIG. 15A, the arm member 31 of the first robot apparatus 11 arranged by the side of the first transfer table 5a is rotated from the 0° state to the 90° state. Simultaneous with this, the internal valve 4 of the first treatment chamber 3a is operated to open the first transfer port 2.

When the arm member 31 rotates, the paired fingers 47 and 48 are rotated at a speed twice as high as the rotating speed of the arm member 31. It follows from this that the 90° rotation of the arm member 31 causes the paired fingers 47 and 48 to rotate in such a manner as to form an angle of 180°. Accordingly, the first finger 47 moves into the region under the semiconductor wafer U1, which is then held above the first transfer table 5a. On the other hand, the second finger 48 moves into the first treatment chamber 3a through the first transfer port 2. After the first finger 47 is positioned under the semiconductor wafer U1, the push pins 6 are lowered, and the semiconductor wafer U1 is placed on the first finger 47.

Figure 15B:
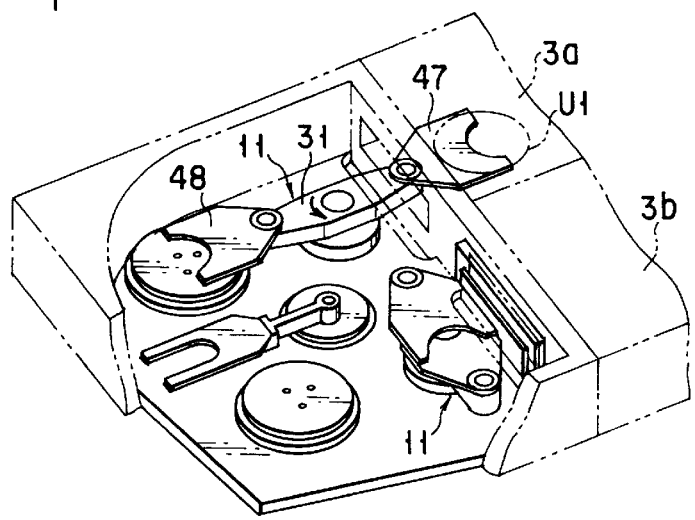

Thereafter, as shown in FIG. 15B, the arm member 31 is rotated 180° from the state depicted in FIG. 15A. As a result of this rotation, the first finger 47 is inserted into the first treatment chamber 3a, with the semiconductor wafer U1 held thereon. In this manner, the untreated semiconductor wafer U1 is transfer into the first treatment chamber 3a.

When the arm member 31 is rotated 180° in the step shown in FIG. 15B, the paired fingers 47 and 48 are rotated 360°. Although they cross each other above the arm member 31 during the rotation, they do not bump against each other since they differ in level.

Figure 15C:
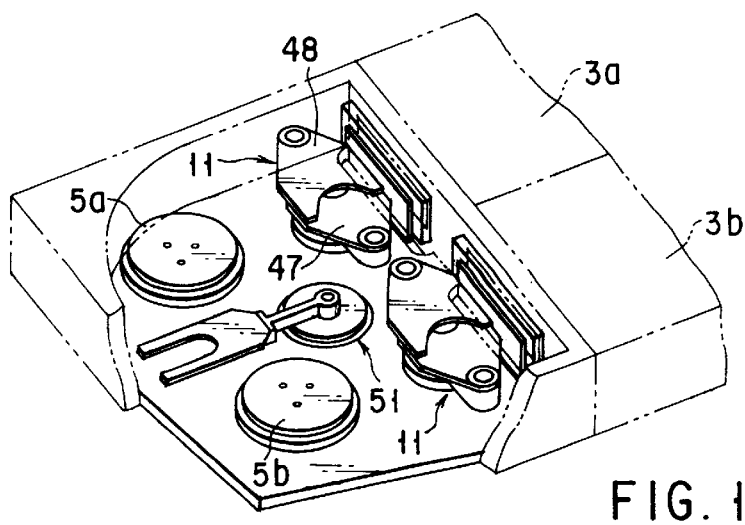

After the semiconductor wafer U1 is transferred into the first treatment chamber 3a, as shown in FIG. 15C, the arm member 31 is returned into the state where the angle of rotation is 0°. In other words, the arm member 31 is initialized.

Figure 16A:
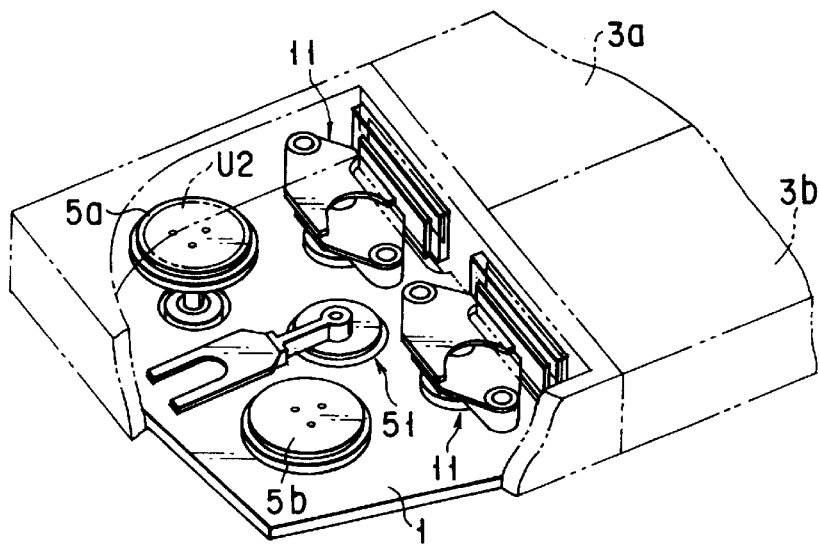
FIGS. 16A to 16C are also explanatory views showing how the treating apparatus of the embodiment operates.

When the semiconductor wafer U1 is being treated in the treatment chamber 3a, the next untreated semiconductor wafer U2 is supplied onto the first transfer table 5a. This state is shown in FIG. 16A.

Figure 16B:
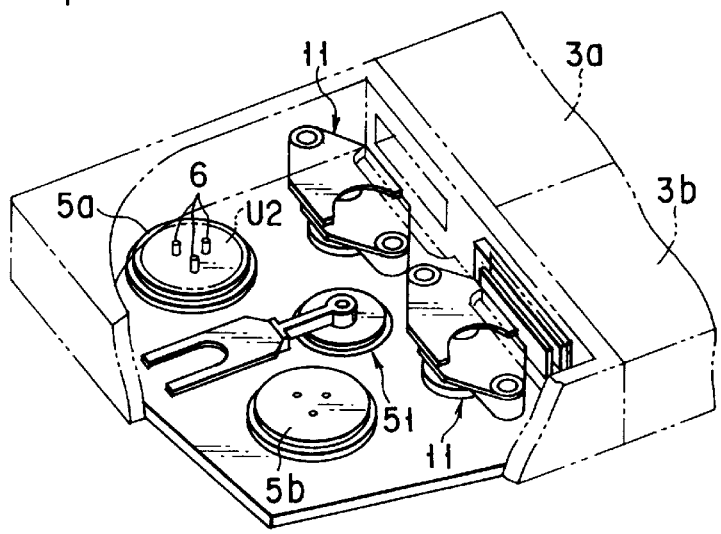
Figure 16C:
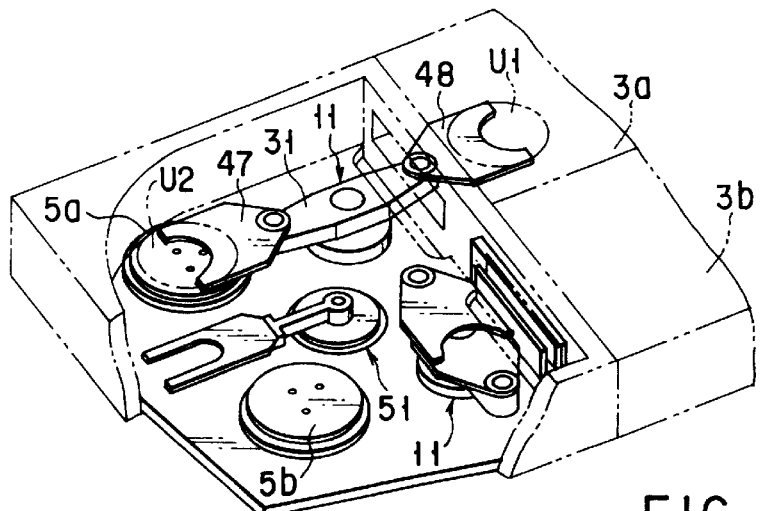

After the semiconductor wafer U1 is treated, the push pins 6 of the first transfer table 5a are raised to lift the semiconductor wafer U2, as shown in FIG. 16B. Then, as shown in FIG. 16C, the arm member 31 is rotated 90°. As result of this rotation, the first finger 47 receives the semiconductor wafer U2 from the first transfer table 5a, and the second finger 48 moves into the first treatment chamber 3a to receive the semiconductor wafer U1 treated therein.

Figure 17A:
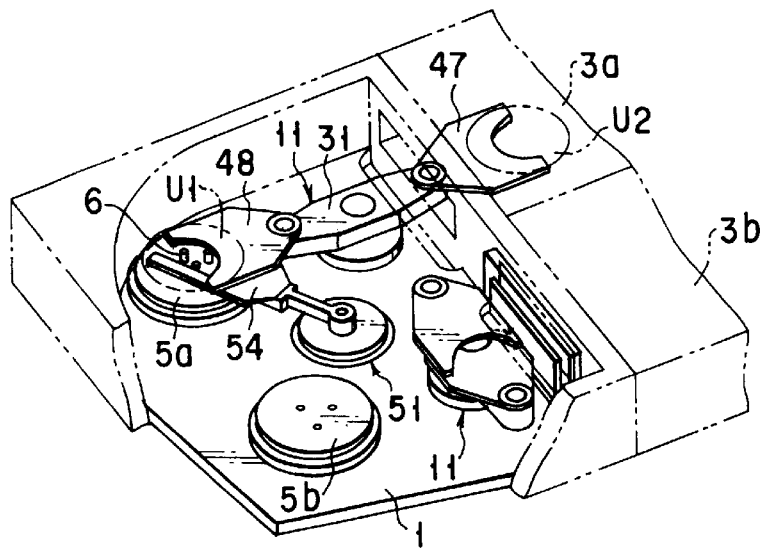
FIGS. 17A to 17C are also explanatory views showing how the treating apparatus of the embodiment operates.

After the first and second fingers 47 and 48 receive the semiconductor wafers U1 and U2, respectively, as shown in FIG. 17A, the arm member 31 is rotated 180°. In response to this rotation, the finger 54 of the second robot apparatus 51 is rotated to the position above the first transfer table 5a. At this position, the finger 54 is located under the second finger 48.

In this state, the push pins 6 of the first transfer table 5a are raised, and the treated semiconductor wafer U1 held on the second finger 48 is transferred to the first transfer table 5a. The untreated semiconductor wafer U2 held on the first finger 47 is transferred to the first treatment chamber 3a.

Figure 17B:
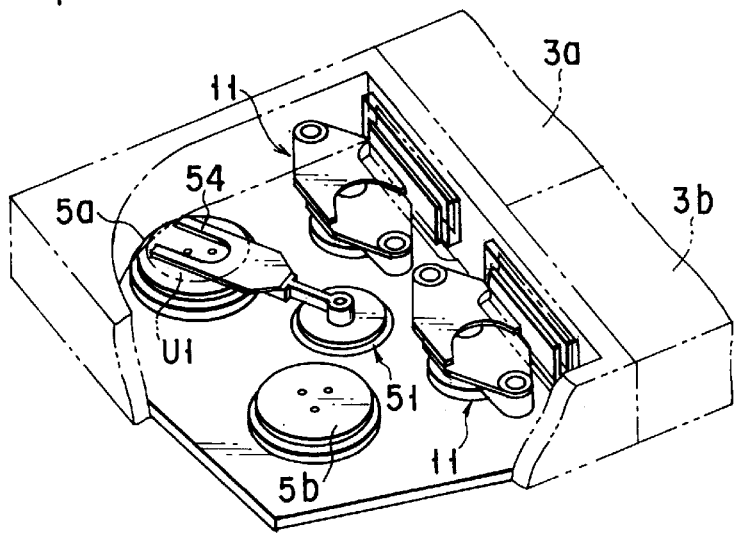

Subsequently, as shown in FIG. 17B, the arm member 31 of the first robot apparatus 11 is rotated and set in the 0° angle state. Simultaneous with this, the push pins 6 of the first transfer 5a are lowered, and the semiconductor wafer U1 is transferred onto the finger 54 of the second robot apparatus 51.

Figure 17C:
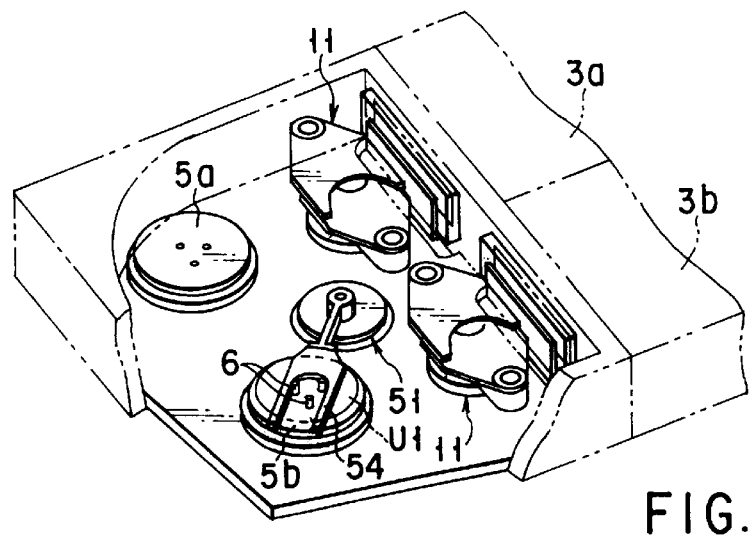

After receipt of the semiconductor wafer U1, the finger 54 is rotated to the position above the second transfer table 5b, as shown in FIG. 17C. Then, the push pins 6 of this table 5b are raised, for the transfer of the semiconductor wafer U1.

Figure 18A:
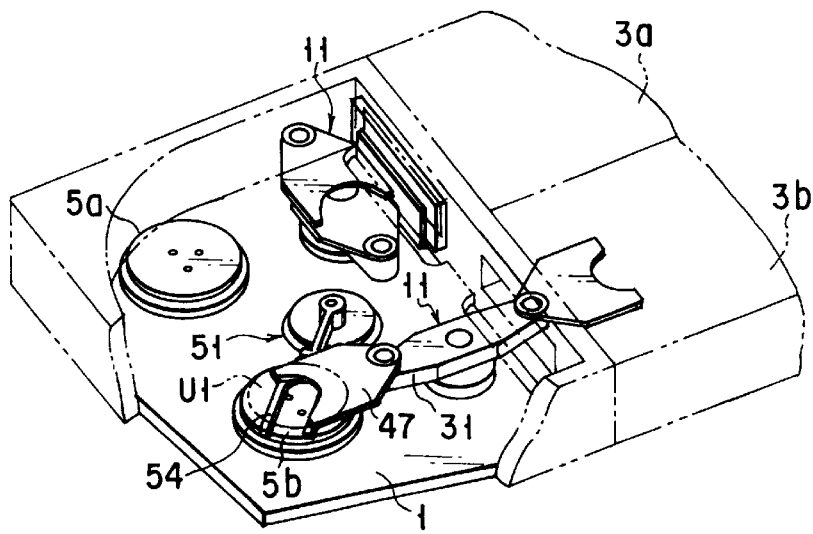
FIGS. 18A to 18C are also explanatory views showing how the treating apparatus of the embodiment operates.

As shown in FIG. 18A, the arm member 31 of the first robot apparatus 11 corresponding to the second transfer table 5b (i.e., the arm member 31 located close to the second treatment chamber 3a) is rotated from the 0° state to the 90° state. As a result of this rotation, the first finger 47 of the arm member 31 moves into the region defined between the lower side of the semiconductor wafer U1 and the upper side of the finger 54 of the second robot apparatus 51. In this state, the push pins 6 are lowered, so that the semiconductor wafer U1 treated in the first treatment chamber 3a is transferred onto the first finger 47.

Figure 18B:
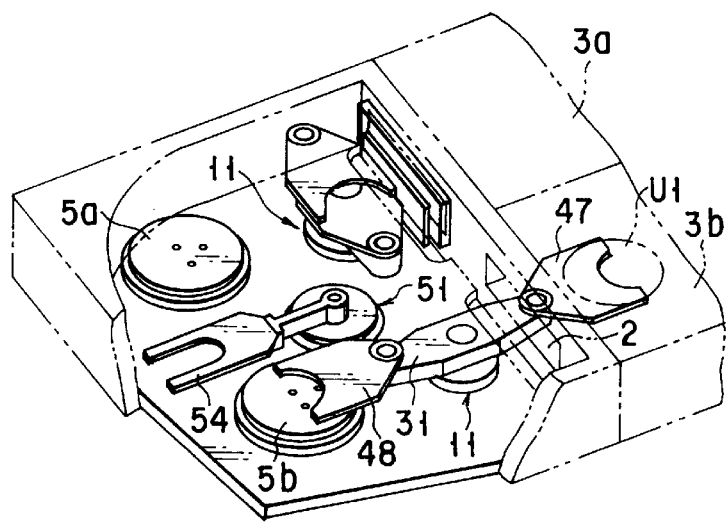

After the first finger 47 receives the semiconductor wafer U1, as shown in FIG. 18B, the arm member 31 is rotated 180°. In response to this rotation, the first transfer port 2 communicating with the second treatment chamber 3b is opened. The first finger 47 holding the semiconductor wafer U1 thereon moves into the second treatment chamber 3b. The semiconductor wafer U1 treated in the first treatment chamber 3a is thus transferred into the second treatment chamber 3b.

Figure 18C:
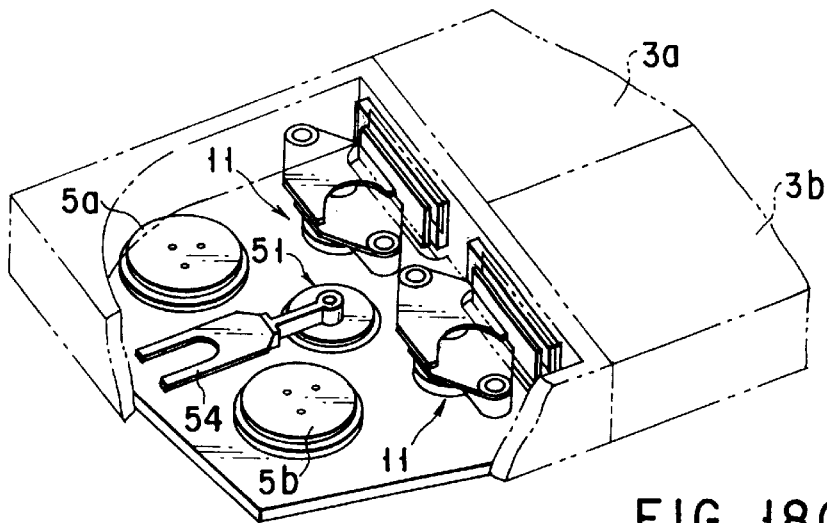

After the semiconductor wafer U1 is placed inside the second treatment chamber 3b, the arm member 31 is rotated 90° and set in the standby state, as shown in FIG. 18C. In the meantime, the semiconductor wafer U1 is subjected to another kind of treatment in the second treatment chamber 3b.

After the semiconductor wafer U1 is treated in the second treatment chamber 3b, it is taken out from the second treatment chamber 3b by the first robot apparatus 11 located close to that treatment chamber 3b, and transferred to the second transfer table 5b.

After the semiconductor wafer U1 is placed on the second transfer table 5b, this table 5b is raised until the load lock chamber 7 is hermetically sealed. Then, the atmospheric pressure valve 9 is driven, and the second transfer port 8 is opened. Through the second transfer port 8, the semiconductor wafer U1 is conveyed to the outside.

In the processing apparatus described above, the first robot apparatus 11 changes its direction by the rotation of the arm member 31. Simultaneous with this, the paired fingers 47 and 48 are rotated in such a manner that they are projected from the arm member 31.

With this structure, the tact time needed for receiving a semiconductor wafer U from the predetermined location and transferring it to another location is as short as possible.

The rotating speed of the arm member 31 to that of the paired fingers 47 and 48 is set to be 1:2. It is therefore desirable that the paired fingers 47 and 48 be so positioned as to overlap with the arm member 31 when the angle of rotation of the arm member 31 is 0°. Where the fingers 47 and 48 are positioned in this manner, the 90° rotation of the arm member 31 causes the fingers 47 and 48 to align with the arm member 31 in an extension line of the longitudinal axis of the arm member 31. When, in this state, the arm member 31 is rotated 180°, the fingers 47 and 48 are located in the extension line of the longitudinal axis of the arm member 31, but take the positions opposite to the positions where they have been.

With this structure, when one of the fingers 47 and 48 receives a semiconductor wafer U from a predetermined location, the other finger 47 or 48 can transfer another semiconductor wafer U to a given location.

In the state where the fingers 47 and 48 are located in the extension line of the longitudinal axis of the arm member 31, the arm member 31 is rotated in such a direction as to reduce the angle of rotation to 0°. By this rotation of the arm member 31, the fingers 47 and 48 can be rotated in such directions as to overlap with the arm member 31. With this structure, the radius of gyration required of the arm member 31 can be as small as possible.

In the present embodiment, the transfer chamber 1 has two transfer ports 2 arranged side by side, and the treatment chambers 3a and 3b communicate with these two transfer ports 2, respectively. In other words, the treatment chambers 3a and 3b are also arranged side by side.

In comparison with the conventional technology wherein a number of treatment chambers are circumferentially arranged, with a robot apparatus as a center, the structure described in the preceding paragraph permits the overall installation space to be as small as possible.

In the first embodiment, one first robot apparatus 11 is arranged between each of the treatment chambers 3a and 3b and the corresponding one of the transfer tables 5a and 5b. With this structure, the operation of transferring a semiconductor wafer U with reference to the transfer tables 5a and 5b and the operation of transferring another semiconductor wafer U with reference to the processing chambers 3a and 3b can be executed in synchronism with each other. Accordingly, the tact time can be as short as possible.

The second robot apparatus 51 is arranged between the paired transfer tables 5a and 5b, so as to transfer a semiconductor wafer U between these transfer tables 5a and 5b. With this structure, a semiconductor wafer U treated in the first treatment chamber 3a can be fed into the second treatment chamber 3b by way of the first and second transfer tables 5a and 5b. Hence, two kinds of treatments can be successively performed with respect to the semiconductor wafer.

The first embodiment was described, referring to the case where a semiconductor wafer U treated in the first treatment chamber 3a is further treated in the second treatment chamber 3b by use of the second robot apparatus 51 arranged between the paired transfer tables 5a and 5b. If two kinds of treatments need not be executed in succession, the first treatment chamber 3a and the second treatment chamber 3b can be used in parallel for different semiconductor wafers U.

The number of treatment chambers juxtaposed need not be two. Three or more treatment chambers may be juxtaposed as the need arises.

In the first robot apparatus 11, the stationary pulley 38 may be replaced with upper and lower pulleys (not shown). In this case, a first endless timing belt is wound around rotatable pulley 41 and one of the upper and lower pulleys, and a second endless timing belt is wound around rotatable pulley 42 and the other one of the upper and lower pulleys. By use of this alternative structure, the rotatable pulleys 41 and 42 can be rotated in accordance with the rotation of the arm member 31.

Figure 19:
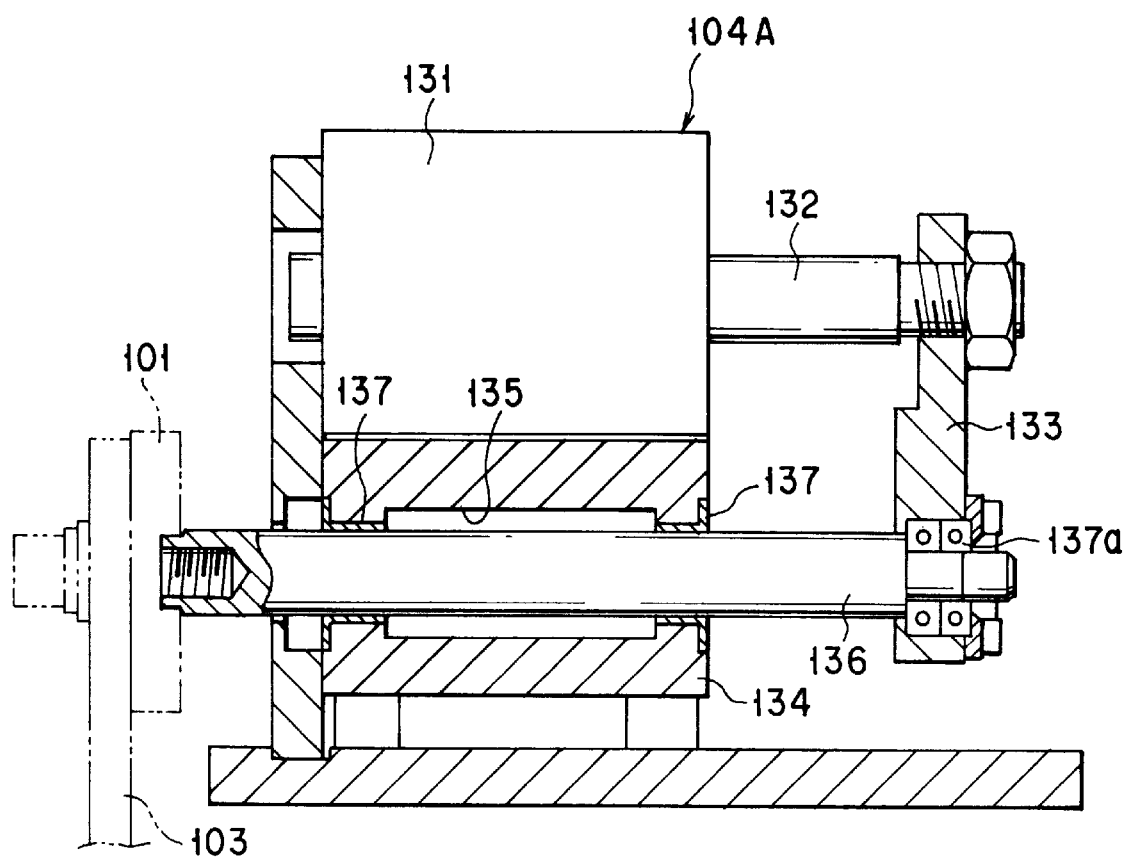
FIG. 19 is a sectional view of the driving means of the atmospheric pressure valve according to the second embodiment of the present invention.
Figure 20:
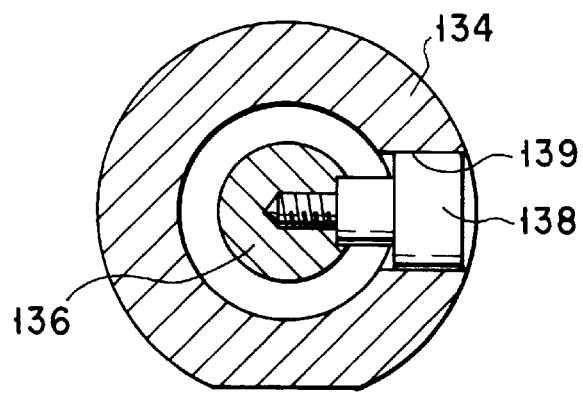
FIG. 20 is a support member of the second embodiment.
Figure 21:
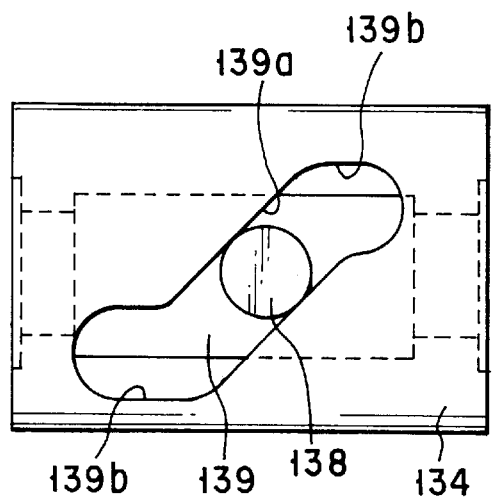
FIG. 21 is a side view of the support member of the second embodiment and simultaneously shows a cam groove formed in the cam member in the developed state.

FIGS. 19 through 21 show the second embodiment of the present invention. The second embodiment is directed to a modification of the driving means 104A for driving the atmospheric pressure valve 9. As shown in FIG. 19, the driving means according to the modification comprises a cylinder 131. The cylinder 131 has a piston rod 132 which is linearly driven by air pressure. A coupling member 133 is attached at one end to that end of the piston rod 132 which is projected from the cylinder 131.

A support member 134 is arranged under the cylinder 131. The support member 134 has an insertion hole 135 extending in the axial direction, and an interlocking shaft 136 is inserted into the insertion hole 135. Bushes 137 are provided at the respective ends of the insertion hole 135, and the interlocking shaft 136 is supported in such a manner that it is rotatable and is axially slidable.

One end of the interlocking shaft 136 is rotatably coupled to the other end of the coupling member 133 by means of bearings 137a, while the other end of the interlocking shaft 136 is connected to the valve body 101 of the atmospheric pressure valve 9 and one end of an arm member 103.

As shown in FIG. 20, a cam follower 138 is rotatably provided near the outer circumferential surface of the interlocking shaft 136. The cam follower 138 is located at a middle portion of the interlocking shaft 136 and is therefore inside the support member 134. The cam follower 138 is in rolling engagement with a cam groove 139 which is bored through the circumferential wall of the support member 134 in the thickness direction.

FIG. 21 is a side view of the support member 134. The cam groove 139 has an inclined section 139a, and a linear section 139b being continuous with the inclined section 139a and having a predetermined length. When the piston rod 132 is driven, and the interlocking shaft 136 interlocks with the movement of the piston rod 132, the cam follower 138 rolls along the cam groove 139.

The interlocking shaft 136 linearly moves and rotates. In accordance with this motion of the shaft 136, the valve body 101 is driven by means of the arm member 103. The second transfer port 8 is opened or closed by means of this valve body 101. The cam groove 139 need not have the shaped described above; it may have a shape identical to that of the cam groove of the first embodiment.

According to the second embodiment, the interlocking shaft 136 interlocks with the linear movement of the piston rod 132, the cam groove 139 described above is formed in the support member 134 that supports the interlocking shaft 136, and the cam follower 138 provided for the interlocking shaft 136 is in engagement with the cam groove 139.

With this structure, the piston rod 132 does not have to have a cam groove, as in the first embodiment. Hence, the piston rod 132 is very rigid. In addition, it is not the piston rod 132 but the interlocking shaft 136 that is rotated. In comparison with the case where the piston rod 132 is rotated, the valve body 101 can be rotated very smoothly.

Figure 22:
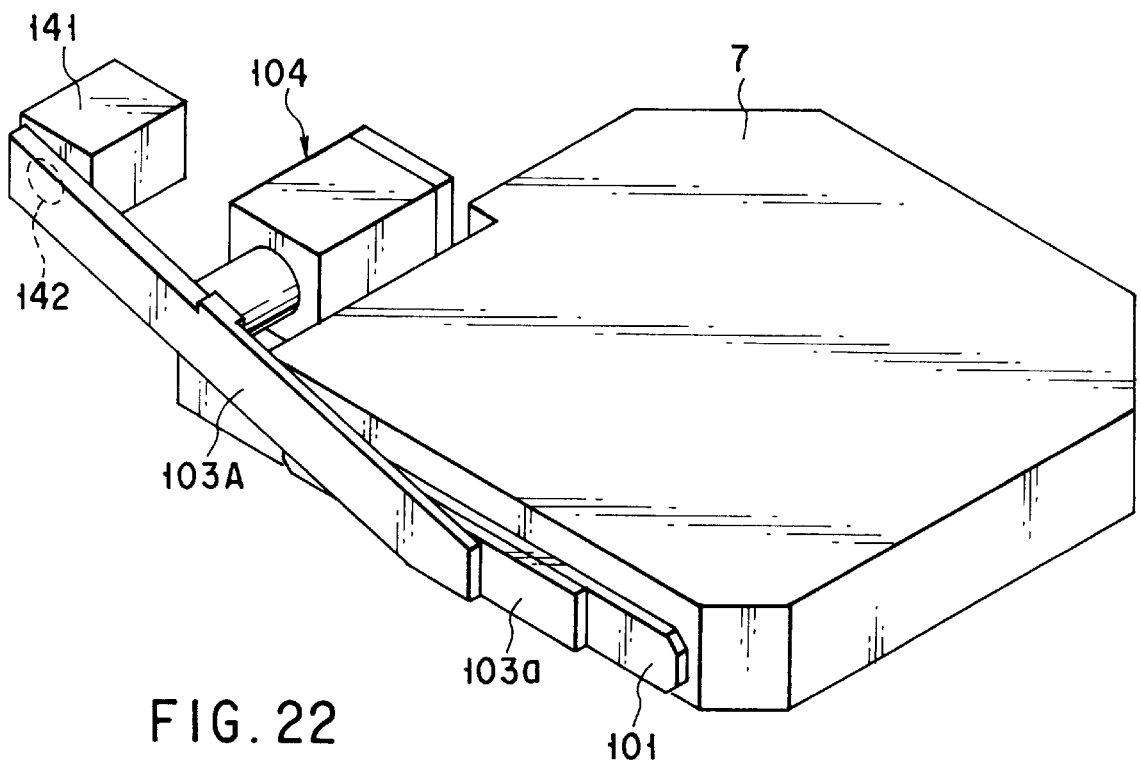
FIG. 22 is a perspective view showing a load lock chamber according to the third embodiment of the present invention.

FIG. 22 shows the third embodiment of the present invention. The third embodiment is directed to a modification of the structure for driving the atmospheric pressure valve 9. In FIG. 22, the same reference numerals as used in the descriptions of the first embodiment are used to represent similar structural elements, and no detailed explanation of such elements will be made.

According to the third embodiment, an arm member 103A, to which a valve body 101 is coupled, is more elongated than that of the arm member employed in the first embodiment. A middle portion of the arm member 103A is coupled to the piston rod (not shown in FIG. 22) of a driving means 104. The valve body 101 is attached to one end of the arm member 103A by means of an attachment plate 103a. In the state where the valve body 101 closes a second transfer port 8, the other end of the arm member 103A contacts a dummy load 141, which is arranged on one side of the driving means 104. The contact at the other end of the arm member 103A is provided with an O-ring 142. This O-ring 142 has the same cross section and diameter as an O-ring 102 attached to the valve body 101. In other words, the condition under which the other end of the arm member 103A is in contact with the dummy load 141 is similar to the condition under which the valve body 101 closes the second transfer port 8.

In this manner, the other end of the arm member 103A is set in contact with the dummy load 141. With this structure, when the valve body 101 is set in contact with the load lock chamber 7 and thus closes the second transfer port 8, the reaction caused at the other end of the arm member 103A is absorbed by the dummy load 141. Since, therefore, one end of the arm member 103A is prevented from curving, the valve body 101 can seal the second transfer port 8 in a reliable manner.

Figure 23:
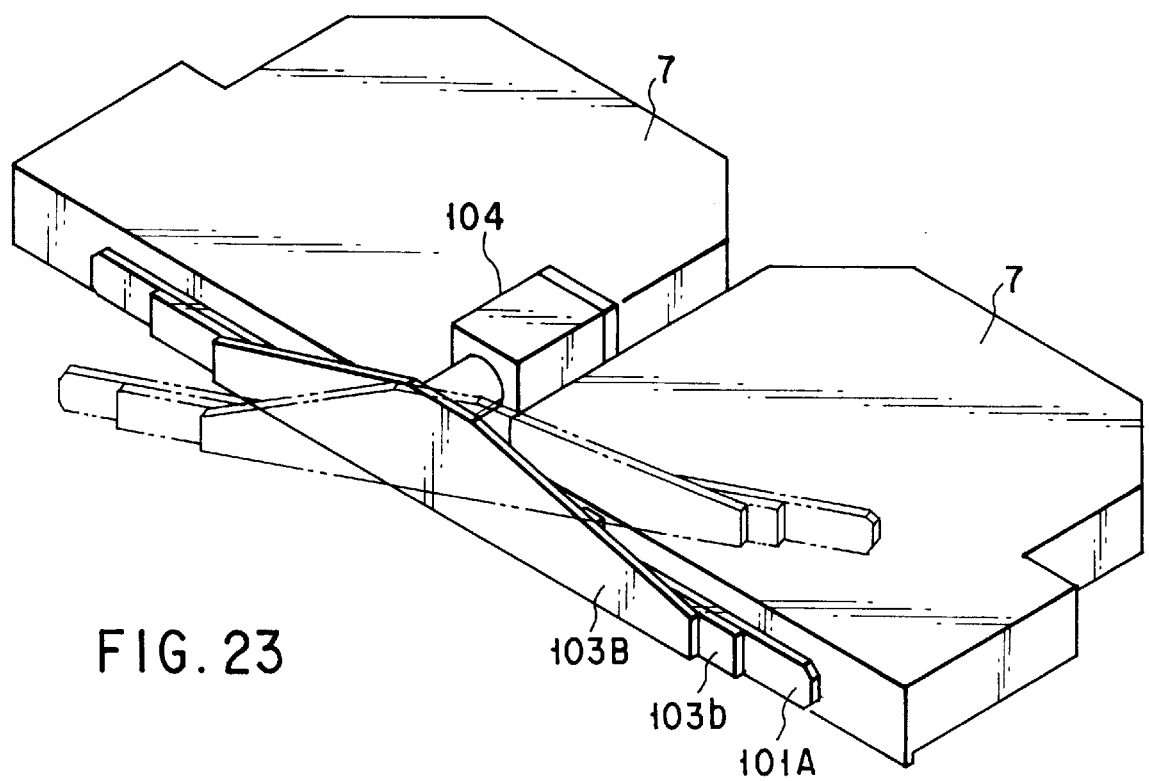
FIG. 23 is a perspective view showing a load lock chamber according to the fourth embodiment of the present invention.

FIG. 23 shows the fourth embodiment of the present invention. The fourth embodiment is useful when two load lock chambers 7 are juxtaposed. According to the fourth embodiment, one driving means 104 is arranged between a pair of load lock chambers 7. A middle portion of the arm member 103B is coupled to the piston rod (not shown in FIG. 23) of the driving means 104. A valve body 101A is attached to the arm member 103B by means of an attachment plate 103b. The valve body 101A is long enough to close the two transfer ports 8 of the two load lock chambers 7 at one time. To be more specific, the valve body 101A can close one of the second transfer port 8 with one longitudinal end thereof, and can close the other second transfer port 8 with the other longitudinal end thereof.

When the two second transfer ports 8 are closed, reactions acting in the opposite directions are produced between the longitudinal ends of the valve body 101A. Accordingly, the longitudinal ends of the valve body 101A can close the second transfer ports 8 in a reliable manner.

Figure 24:
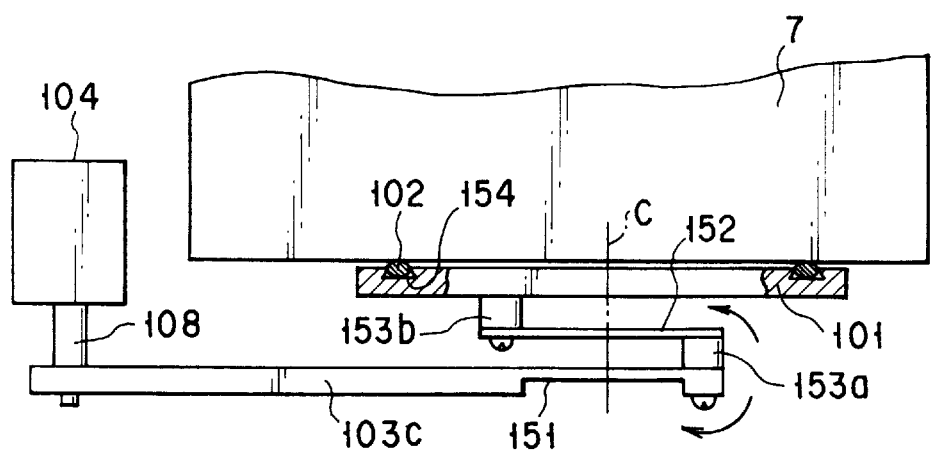
FIG. 24 is a plan view schematically showing the driving means of a valve body according to the fifth embodiment of the present invention.

FIG. 24 shows a fifth embodiment of the present invention. According to the fifth embodiment, one end of an arm member 103C is coupled to the piston rod 108 of a driving means 104. The other end of the arm member 103C has a cutout spring section 151. A belt-like coupling member 152, which has a spring function, has a first projection 153a formed on one side at one end, and this projection 153a is fixedly coupled to the other end of the arm member 103C. The belt-like coupling member 152 has a second projection 153b formed on the other side at the other end, and this projection 153b is fixedly coupled to a middle portion of a valve body 101.

The valve body 101 has a dovetail groove 154 formed in that side surface which is brought into contact with a load lock chamber 7. An O-ring 102 is held in the dovetail groove 154 in such a manner that it does not come off.

The cutout spring section 151, the belt-like coupling member 152 and the valve body 101 are positioned in such a manner that their longitudinal centers coincide with one another. The other end of the belt-like coupling member 152 is shifted in one direction (toward the piston rod 108) from the longitudinal center of the valve body 101.

With this structure, when the valve body 101 is pressed against the outer wall of the load lock chamber 7, closing the second transfer port 8, the reaction from the valve body 101 is transmitted to both the belt-like coupling member 152 and the arm member 103C.

The reaction transmitted to the belt-like coupling member 152 and the reaction transmitted to the arm member 103C are equal. Where the coupling member 152 and the arm member 103C are equal in spring constant, they bend to the same extent. In other words, their degrees of deformation are on the same level. In spite of the reaction, therefore, the valve body 101 is kept parallel to the closed port. In this manner, the valve body 101 is prevented from bending, and the closed state of the second transfer port 8 can be reliably maintained.

In the fifth embodiment, the cutout spring section 151 is provided for one end portion of the arm member 103C. Instead of this structure, the arm member 103C itself may be formed of a spring steel plate so that it can have a spring function throughout its overall length. In other words, the arm member 103C is required to have a spring function only at the end portion to which the belt-like coupling member 152 is coupled. The cutout spring section 151 is integral with the arm member 103C. Unlike an ordinary type of floating mechanism, the floating mechanism of the fifth embodiment does not have sliding portions, and therefore does not generate particles, such as dust particles.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A treating apparatus for treating a work in a vacuum state, comprising:

a transfer chamber having one side in which a plurality of first transfer ports are formed side by side;

a plurality of treatment chambers connected to the first transfer ports, respectively, and arranged side by side;

transfer tables arranged inside the transfer chamber and located at positions opposed to the respective first transfer ports, said transfer tables receiving untreated works externally supplied thereto and also receiving works that have been treated in the respective treatment chambers; and a first robot apparatus provided between each of the transfer tables and a corresponding one of the treatment chambers so as to transfer a work therebetween.

2. A processing apparatus according to claim 1, wherein each said first robot apparatus comprises:

an attachment member;

an arm member rotatably provided for the attachment member;

driving means for rotating the arm member;

a stationary pulley provided for the attachment member and located at a center of rotation of the arm member;

a pair of rotatable pulleys rotatably provided for respective end portions of the arm member;

a pair of fingers which are attached at one end to the rotatable pulleys, respectively, and which are rotated together with the rotatable pulleys, so as to convey the work; and driving force transmitting means, engaged with the stationary pulley and the rotatable pulleys, for rotating the rotatable pulleys in response to rotation of the arm member, said driving force transmitting means rotating the rotatable pulleys in accordance with an outer diameter ratio of the stationary pulley to the rotatable pulleys.

3. A treating apparatus according to claim 1, wherein a second robot apparatus is arranged between adjacent ones of the transfer tables, said second robot being used for transferring a work between the adjacent ones of the transfer tables.

4. A processing apparatus according to claim 1, wherein:

said transfer chamber has a second transfer port formed in a side wall opposite to said one side and opened or closed by an atmospheric pressure valve; and said atmospheric pressure valve includes: a valve body for opening or closing the second transfer port; an arm member having a first end connected to the valve body; and driving means, to which a second end of the arm member is connected, for causing the arm member to linearly move the valve body in a direction closer to or away from the second transfer port and for causing the arm member to rotate the valve body around an axis extending in said direction.

5. A treating apparatus according to claim 4, wherein said driving means includes: a cylinder; a piston rod provided for the cylinder to be axially movable, said piston rod being driven in an axial direction of the cylinder by means of air pressure, said piston rod having one end which is projected out of the cylinder and to which the second end of the arm member is coupled; a cam groove formed in an outer circumferential surface of the piston rod; and a guide shaft, engaged with the cam groove, for allowing the piston rod to rotate in a circumferential direction in accordance with the shape of the cam groove when the piston rod is driven inside the cylinder in the axial direction.

6. A treating apparatus according to claim 4, wherein said driving means includes: a cylinder; a piston rod provided for the cylinder to be axially movable; an interlocking shaft having a first end which is rotatably coupled to the piston rod and a second end to which the second end of the arm member is coupled; a support member for slidably supporting the interlocking shaft, said support member having a circumferential wall in which a cam groove is formed; and a cam follower which is provided for the interlocking shaft, is engaged with the cam groove, and allows the interlocking shaft to rotate in a circumferential direction in accordance with the shape of the cam groove when the interlocking shaft is axially driven while interlocking with movement of the piston rod.

* * * * *